US012768035B2

(12) United States Patent
Naveh

(10) Patent No.: US 12,768,035 B2
(45) Date of Patent: Oct. 20, 2026

(54) GRAPHENE COATED SURFACES MANUFACTURED BY ATOMIC OR MOLECULAR LAYER DEPOSITION

(71) Applicants: 2D GENERATION LTD., Yehud-Monosson (IL); BAR-ILAN UNIVERSITY, Ramat Gan (IL)

(72) Inventor: Doron Yaacov Naveh, Petach Tikva (IL)

(73) Assignees: 2D GENERATION LTD., Yehud-Monosson (IL); BAR-ILAN UNIVERSITY, Ramat Gan (IL)

(*) Notice: Subject to any disclaimer, the term of this patent is extended or adjusted under 35 U.S.C. 154(b) by 88 days.

(21) Appl. No.: 18/835,836

(22) PCT Filed: Feb. 15, 2023

(86) PCT No.: PCT/IL2023/050158

§ 371 (c)(1),
(2) Date: Aug. 5, 2024

(87) PCT Pub. No.: WO2023/156997

PCT Pub. Date: Aug. 24, 2023

(65) Prior Publication Data

US 2025/0137120 A1 May 1, 2025

Related U.S. Application Data

(60) Provisional application No. 63/437,061, filed on Jan. 4, 2023, provisional application No. 63/310,307, filed on Feb. 15, 2022.

(51) Int. Cl.

| | |
|---|---|
| ***C23C 16/26*** | (2006.01) |
| ***C23C 16/04*** | (2006.01) |

(52) U.S. Cl.
CPC ............ *C23C 16/26* (2013.01); *C23C 16/045* (2013.01)

(58) Field of Classification Search
CPC .............................. C23C 16/26; C23C 16/045
See application file for complete search history.

(56) References Cited

U.S. PATENT DOCUMENTS

| | | |
|---|---|---|
| 6,110,817 A | 8/2000 | Tsai et al. |
| 7,259,463 B2 | 8/2007 | Huang et al. |

(Continued)

FOREIGN PATENT DOCUMENTS

| | | |
|---|---|---|
| CN | 102593098 A | 7/2012 |
| CN | 102709155 A | 10/2012 |

(Continued)

OTHER PUBLICATIONS

English Translation of JP 2013-513544.*

(Continued)

*Primary Examiner* — Bret P Chen
(74) *Attorney, Agent, or Firm* — The Roy Gross Law Firm, LLC; Roy Gross

(57) ABSTRACT

A product comprising a graphene coated surface that has a 3D profile having a GAR higher than 3; and/or the normalized 50% thickness penetration depth of the graphene coated pattern is higher than 0.5. When the product is an interconnect it (i) has a grain size median lower than 0.9 micron; (ii) has a lower degree of shorts and voids compared to a similar interconnect exposed to temperatures equal or higher than 400° C.; (iii) is substantially free of diffusion barrier coating materials in the interconnect metal; (iv) is free of nitrogen doping, (v) is free of $FeCl_3$ residuals; and/or (vi) is free of residual metal catalyst nanoparticles. The coating of 3D profile surface with graphene is obtained by molecular layer deposition of a graphene molecular precursor comprising an (Continued)

comprising at least one $C_6$-$C_{100}$ aromatic hydrocarbon on top of the surface followed by transforming the molecular graphene precursor into a graphene coating by means of a carbon-carbon bond formation reaction.

2 Claims, 3 Drawing Sheets

(56) References Cited

U.S. PATENT DOCUMENTS

| | | | | |
|---|---|---|---|---|
| 8,158,200 | B2 * | 4/2012 | Kelber | B32B 9/041 427/249.1 |
| 8,716,863 | B2 | 5/2014 | Wann et al. | |
| 8,808,810 | B2 * | 8/2014 | Veerasamy | C03C 17/42 427/508 |
| 8,974,617 | B2 | 3/2015 | Hu et al. | |
| 9,006,095 | B2 | 4/2015 | Yang et al. | |
| 9,142,505 | B2 | 9/2015 | Yang et al. | |
| 9,318,439 | B2 | 4/2016 | Yang et al. | |
| 9,330,970 | B2 | 5/2016 | Wann et al. | |
| 9,385,034 | B2 | 7/2016 | Chang et al. | |
| 9,595,436 | B2 * | 3/2017 | Beasley | C01B 32/184 |
| 10,050,104 | B2 | 8/2018 | Jou et al. | |
| 10,683,586 | B2 | 6/2020 | Ozyilmaz et al. | |
| 10,984,830 | B2 | 4/2021 | Ozyilmaz et al. | |
| 2011/0033677 | A1 | 2/2011 | Shin et al. | |
| 2011/0143045 | A1 * | 6/2011 | Veerasamy | C01B 32/194 427/510 |
| 2011/0210282 | A1 | 9/2011 | Foley | |
| 2012/0141799 | A1 | 6/2012 | Kub et al. | |
| 2012/0181508 | A1 * | 7/2012 | Chang | H10D 30/01 257/29 |
| 2013/0299988 | A1 | 11/2013 | Bonilla et al. | |
| 2014/0263166 | A1 | 9/2014 | Shin et al. | |
| 2015/0023860 | A1 | 1/2015 | Lee et al. | |
| 2015/0270350 | A1 | 9/2015 | Lagally et al. | |
| 2016/0202613 | A1 | 7/2016 | Di et al. | |
| 2016/0270237 | A1 | 9/2016 | Cho et al. | |
| 2016/0339160 | A1 | 11/2016 | Bedworth et al. | |
| 2017/0148631 | A1 * | 5/2017 | Beasley | H10P 14/3406 |
| 2018/0005952 | A1 | 1/2018 | Zhou | |
| 2018/0033734 | A1 | 2/2018 | Zhou | |
| 2018/0212151 | A1 | 7/2018 | Chen et al. | |
| 2018/0244524 | A1 | 8/2018 | Ozyilmaz et al. | |
| 2020/0135655 | A1 | 4/2020 | Yang et al. | |
| 2020/0186938 | A1 | 6/2020 | Zeltzer et al. | |
| 2021/0017641 | A1 * | 1/2021 | Ling | H10B 43/35 |
| 2021/0217660 | A1 * | 7/2021 | Huang | H01J 37/321 |
| 2022/0254641 | A1 | 8/2022 | Chua et al. | |
| 2025/0137126 | A1 | 5/2025 | Naveh | |

FOREIGN PATENT DOCUMENTS

| | | | | | |
|---|---|---|---|---|---|
| CN | 103482611 | | * | 1/2014 | C01B 31/04 |
| CN | 103943562 | A | | 7/2014 | |
| CN | 102569183 | | * | 7/2015 | H01L 21/768 |
| CN | 104589725 | B | | 12/2016 | |
| CN | 107658264 | A | | 2/2018 | |
| CN | 110666158 | A | | 1/2020 | |
| CN | 217455186 | U | | 9/2022 | |
| DE | 102022204958 | A1 | | 11/2022 | |
| DE | 102024114275 | A1 | | 11/2024 | |
| JP | 2013-513544 | | * | 4/2013 | C01B 31/02 |
| KR | 101199538 | B1 | | 11/2012 | |
| KR | 101472118 | B1 | | 12/2014 | |
| WO | 2013/136908 | A1 | | 9/2013 | |
| WO | 2016/156659 | A1 | | 10/2016 | |
| WO | 2021/138665 | A1 | | 7/2021 | |
| WO | WO 2021/156196 | | * | 8/2021 | C01B 32/186 |
| WO | 2023/004328 | A1 | | 1/2023 | |
| WO | 2023/004329 | A1 | | 1/2023 | |
| WO | 2023/275873 | A1 | | 1/2023 | |
| WO | 2023/042210 | A1 | | 3/2023 | |

OTHER PUBLICATIONS

Nie, Xiao, et al., "Synthesis of interconnected graphene framework with two-dimensional protective layers for stable lithium metal anodes". Energy Storage Materials, vol. 17, Feb. 2019, pp. 341-348.*

Wang, Xuebin, et al., "Three-dimensional strutted graphene grown by substrate-free sugar blowing for high-power-density supercapacitors". Nature Communications |4:2905 pp. 1-8.*

Hesari, Mahdi, et al., "Covalent modification of graphene and micro-diamond with redox active substrates via photogenerated carbenes". Carbon vol. 85, Apr. 2015, pp. 159-167. https://doi.org/10.1016/j.carbon.2014.12.053.

Zhao, Xin-Jing, et al., "Molecular defect-containing bilayer graphene exhibiting brightened luminescence". Sci. Adv. 2020; 6eaay8541, Feb. 28, 2020, pp. 1-6. doi: 10.1126/sciadv.aay8541. PMID: 32158946; PMCID: PMC7048428.

Kozbial, Andrew, et al. "Study on the Surface Energy of Graphene by Contact Angle Measurements". Langmuir. Jul. 22, 2014;30(28):8598-606. doi: 10.1021/la5018328. Epub Jul. 11, 2014. PMID: 24983409.

A Manikandan, H Medina, YZ Chen "Low Temperature Grown Graphene on Ultra-Long Copper Nanowire by Carbon-Enclosed Chemical Vapor Deposition as Stable Transparent Conducting Electrodes"; ECS Meeting Abstracts, vol. MA2016-02, H04-Low-Dimensional Nanoscale Electronic and Photonic Devices 9, 2016—iopscience.iop.org.

Araujo P. T. et al. Defects and impurities in graphene-like materials, Materials Today 2012, 15, 98-109, https://doi.org/10.1016/S1369-7021(12)70045-7.

Bum Jun Kim, Tuqeer Nasir, and Jae-Young Choi "Direct Growth of Graphene at Low Temperature for Future Device Applications"; Journal of the Korean Ceramic Society 2018, 55, 203-223. DOI:10.4191/kcers.2018.55.3.12.

D Nakayama, H Baba, N Toyoda, I Yamada "Relatively low temperature deposition of graphene like films with ethane GCIB irradiation"; Surface and Coatings Technology, 2016—Elsevier; vol. 306, Part A, Nov. 25, 2016, pp. 218-221, https://doi.org/10.1016/j.surfcoat.2016.06.002.

D Zhou, Y Cui, BH Han "Synthesis and Modification of Graphene"; Graphene Optoelectronics: 2014—Wiley Online Library. DOI:10.1002/9783527677788.ch2.

Dapeng Wei and Xianfan Xu "Laser direct growth of graphene on silicon substrate"; Appl. Phys. Lett. 2012, 100, 023110.

G Kalita, K Wakita, M Umeno "Low temperature growth of graphene film by microwave assisted surface wave plasma CVD for transparent electrode application"; Royal Society of Chemistry, RSC Adv., 2012, 2, 2815-2820. DOI: 10.1039/C2RA00648K.

H. Van Bui, a, F. Grilloa and J. R. van Ommena "Atomic and Molecular Layer Deposition: Off the Beaten Track"; Chem. Commun., 2017, 53, 45-71. DOI:10.1039/C6CC05568K.

Houman Zahedmanesh, Victor Vega Gonzalez, and Zsolt Tokei "Nano-Ridge Bending during Conformal Ruthenium Metallization: Implications for Interconnect Fabrication"; ACS Appl. Nano Mater. 2021, 4, 5643-5648. DOI:10.1021/acsanm.1c00773.

Hu J, Ji Y, Shi Y, Hui F, Duan H, Lanza M. A review on the use of graphene as a protective coating against corrosion. Ann. J. Mater. Sci. Eng. 2014;1:16. Hu J, et al (Nov. 1, 2014).

Huaqiang Cao, Cheng Wang, Baojun Li, Tianyu Chen, Peng Han, Yan Zhang, Haijun Yang, Qunyang Li,Anthony K. Cheetham "Successive Free-Radical C(sp2)-C(sp2) Coupling Reactions to Form Graphene"; CCS Chem. 2021, 3, 2735-2748. DOI:10.31635/ccschem.021.202100919.

J Sun, Y Chen, X Cai, B Ma, Z Chen, M Priydarshi "Direct low temperature synthesis of graphene on arbitrary glasses by plasma-enhanced CVD for versatile, cost-effective electrodes"; Nano Res, 2015, https://doi.org/10.1007/s12274-015-0849-0.

Jaeho Kim, Hajime Sakakita, and Hiromoto Itagaki "Low-Temperature Graphene Growth by Forced Convection of Plasma-Excited Radicals"; Nano Lett. 2019, 19, 739-746. DOI: 10.1021/acs.nanolett.8b03769.

Jisu Jang, Myungwoo Son, Sunki Chung, Kihyeun Kim, Chunhum Cho, Byoung Hun Lee and Moon-Ho Ham "Low-temperature-

(56) References Cited

OTHER PUBLICATIONS grown continuous graphene films from benzene by chemical vapor deposition at ambient pressure"; Scientific Reports, 5:17955, 1-7. DOI: 10.1038/srep17955.

Jiyu Cai, Xiaoxiao Han, Xin Wang, and Xiangbo Meng "Atomic Layer Deposition of Two-Dimensional Layered Materials: Processes, Growth Mechanisms, and Characteristics"; Matter 2, 587-630, Mar. 4, 2020.

Lang Jiang, Tianchao Niu, Xiuqiang Lu, Huanli Dong, Wei Chen, Yunqi Liu, Wenping Hu, and Daoben Zhu "Low-Temperature, Bottom-Up Synthesis of Graphene via a Radical-Coupling Reaction"; J. Am. Chem. Soc. 2013, 135, 9050-9054. doi: 10.1021/ja4031825. Epub Jun. 4, 2013. PMID: 23701398.

M. Stelzer et al. Graphenic Carbon: A Novel Material to Improve the Reliability of Metal-Silicon Contacts. IEEE Journal of the Electron Devices Society, 2017, 5, 416-425. 10.1109/JEDS.2017.2724841.

M. Tsai, S. Sun, C. Tsai, S. Chuang, and H.-T. Chiu, "Comparison of the diffusion barrier properties of chemical-vapor-deposited TaN and sputtered TaN between Cu and Si", Journal of Applied Physics, vol. 79, No. 9, pp. 6932-6938, 1996. https://doi.org/10.1063/1.361518.

Manjit Kaur, Neena Gupta, Sanjeev Kumar, Balwinder Raj, Arun K. Singh "RF analysis of intercalated graphene nanoribbon-based global-level interconnects"; Journal of Computational Electronics 2020 19:1002-1013. https://doi.org/10.1007/s10825-020-01530-5.

Masayuki Katagiri, Takashi Matsumoto, Hisao Miyazaki, Ryota Ifuku, Rika Matsumoto, Tadashi Sakai, and Akihiro Kajita "Resistivity Reduction of Multilayer Graphene Interconnects Prepared by Low-Temperature Chemical Vapor Deposition"; ADMETA plus 2015.

Mehta, Ruchit "Towards Integration of Graphene in Advanced CMOS Interconnect Technology"; PurdueUniversity ProQuest Dissertations & Theses, 2016. 10191315. Available online: [https://docs.lib.purdue.edu/cgi/viewcontent.cgi?article=2608&context=open_access_dissertations.

N Toyoda, I Yamada "Low Temperature Graphene Film Formation with Ethane Cluster Ion Implantation"; 2016 21st International Conference on Ion Implantation Technology (IIT), 2016—ieeexplore.ieee.org. doi: 10.1109/IIT.2016.7882889.

P.O. Oviroh et al."New development of atomic layer deposition: processes, methods and applications",Science and Technology of Advanced Materials, 20(1), 465-496. https://doi.org/10.1080/14686996.2019.1599694.

R Mehta, S Chugh, Z Chen "Transfer-free multi-layer graphene as a diffusion barrier"; Nanoscale, Issue 5, 2017—pubs.rsc.org.

R Mehta, S Chugh, Z Chen "Enhanced electrical and thermal conduction in graphene-encapsulated copper nanowires"—Nano letters, 2015—ACS Publications; vol. 15/Issue 3.

Riteshkumar Vishwakarma, Rucheng Zhu, Amr Attia Abuelwafa, Yota Mabuchi, Sudip Adhikari, Susumu Ichimura, Tetsuo Soga, and Masayoshi Umeno "Direct Synthesis of Large-Area Graphene on Insulating Substrates at Low Temperature using Microwave Plasma CVD"; ACS Omega 2019, 4, 11263-11270. Available online: [https://pubs.acs.org/doi/epdf/10.1021/acsomega.9b00988?ref=article_openPDF].

Ryota Ifuku, Takashi Matsumoto, Tadashi Sakai, and Akihiro Kajita "Catalyst-free Growth of Graphene on 300mm Dielectric Substrate by Microwave Plasma-Enhanced Chemical Vapor Deposition at Low Temperatures"; ADMETA Plus 2017.

S Kataria, S Wagner, MC Lemme "Scalable Growth of Two-Dimensional Materials—a Prerequisite forProcess Integration"; ECS Transactions, 2017, vol. 80, No. 4—iopscience.iop.org; DOI:10.1149/MA2017-02/26/1154.

S. Cwik et al. "Thermal atomic layer deposition of ruthenium metal thin films using nonoxidative coreactants", J. Vac. Sci. Technol. A 38, 012402 (2020); https://doi.org/10.1116/1.5125109.

SS Pei, QK Yu, KP Huang, SR Xing "Synthesis of graphene and other 2D material: The past and future of chemical vapor deposition"; 2015 IEEE MTT-S International Microwave Workshop Series on Advanced Materials and Processes for RF and THz Applications (IMWS-AMP), 2015—ieeexplore.ieee.org; doi: 10.1109/IMWS-AMP.2015.7324942.

T Yamada, J Kim, M Ishihara "Low-temperature graphene synthesis using microwave plasma CVD"; Journal of Physics D: Applied Physics, 2013—iopscience.iop.org; DOI 10.1088/0022-3727/46/6/063001.

T Yamada, M Ishihara, J Kim, M Hasegawa, S Iijima "A roll-to-roll microwave plasma chemical vapordeposition process for the production of 294 mm width graphene films at low temperature"; Carbon, 2012; vol. 50, Issue 7, Jun. 2012, pp. 2615-2619—Elsevier; DOI:10.1016/j.carbon.2012.02.020.

T Yamada, M Ishihara, M Hasegawa "Large area coating of graphene at low temperature using a roll-to-rollmicrowave plasma chemical vapor deposition"; Thin Solid Films, 2013—Elsevier; vol. 532, Apr. 1, 2013, pp. 89-93.

Taishi Ishikura, Atsunobu Isobayashi, Daisuke Nishide, Ban Ito, Tatsuro Saito, Takashi Matsumoto, YuichiYamazaki, Hisao Miyazaki, Masahito Watanabe, Naoshi Sakuma, Akihiro Kajita and Tadashi Sakai "Electrical Properties of 30 nm Width Bi-Layer Interconnects of Multi Layer Graphene and Ni"; IITC 2015.

Tao Liang, Yuhan Kong, Hongzheng Chen, and Mingsheng Xu "From Solid Carbon Sources to Graphene"; Chin. J. Chem. 2016, 34, 32-40. DOI: 10.1002/cjoc.201500429.

Tobias Weidner, Nirmalya Ballav, Ulrich Siemeling, Dennis Troegel, Tim Walter, Reinhold Tacke, David G. Castner, and Michael Zharnikov "Tripodal Binding Units for Self-Assembled Monolayers on Gold: A Comparison of Thiol and Thioether Headgroups"; J. Phys. Chem. C 2009, 113, 19609-19617. doi: 10.1021/jp906367t. PMID: 21625327; PMCID: PMC3102536.

Xi Wan, Kun Chen, Danqing Liu, Jian Chen, Qian Miao, and Jianbin Xu "High-Quality Large-Area Graphenefrom Dehydrogenated Polycyclic Aromatic Hydrocarbons"; Chem. Mater. 2012, 24, 3906-3915. dx.doi.org/10.1021/cm301993z.

Y. Kim, W. Song, S. Y. Lee, C. Jeon, W. Jung, M. Kim, and C.-Y. Park "Low-temperature synthesis of graphene on nickel foil by microwave plasma chemical vapor deposition"; Applied Physics Letters 98, 263106 (2011).

Yannic Falke, Boris V. Senkovskiy, Niels Ehlen, Lena Wysocki, Tomas Marangoni, Rebecca A. Durr, Alexander I. Chernov, Felix R. Fischer, and Alexander Grüneis "Photothermal Bottom-up Graphene Nanoribbon Growth Kinetics"; Nano Lett. 2020, 20, 4761-4767.

Yijun Zhang, Wei Ren, Zhuangde Jiang, Shuming Yang, Weixuan Jing, Peng Shi, Xiaoqing Wua and Zuo-Guang Ye "Low-temperature remote plasma-enhanced atomic layer deposition of graphene and characterization of its atomic-level structure"; Mater. Chem. C, 2014, 2, 7570.

Yu Ding, Mengqi Zeng, Lei Fu "Low-temperature synthesis of sp2 carbon nanomaterials"; Science Bulletin 64 (2019) 1817-1829.

YZ Chen, H Medina, HW Tsai, YC Wang "Low temperature growth of graphene on glass by carbon-enclosed chemical vapor deposition process and its application as transparent electrode"; Chemistry of Materials, 2015; vol. 27/Issue 5—ACS Publications. . DOI:10.1021/CM504431D.

Zhenlin Pei, Francky Catthoor, Zsolt Tokei, and Chenyun Pan "Beyond-Cu Intermediate-LengthInterconnect Exploration for SRAM Application"; IEEE Transactions on Nanotechnology, pp. 367-373, 2022, doi: 10.1109/TNANO.2022.3157952.

Li Z, Wu P, Wang C, Fan X, Zhang W, Zhai X, Zeng C, Li Z, Yang J, Hou J. Low-temperature growth ofgraphene by chemical vapor deposition using solid and liquid carbon sources. ACS Nano. Apr. 26, 2011;5(4):3385-90. doi: 10.1021/nn200854p. Epub Mar. 29, 2011. PMID: 21438574.

Shishir Kumar et al. Low Temperature Graphene Growth. 2009 ECS Trans. 19 175. DOI 10.1149/1.3119541.

Kumar, Sachin, et al., "Linking graphene-based material physicochemical properties with molecular adsorption, structure and cell fate". Communications Chemistry (2020) 3:8, pp. 1-11. https://doi.org/10.1038/s42004-019-0254-9.

Wassei, Jonathan K., et al., "Chemical Vapor Deposition of Graphene on Copper from Methane, Ethane and Propane: Evidence for

(56) References Cited

OTHER PUBLICATIONS

Bilayer Selectivity". Small, 2012, 8, No. 9, 1415-1422. DOI: 10.1002/smll.201102276.

* cited by examiner

GRAPHENE COATED SURFACES MANUFACTURED BY ATOMIC OR MOLECULAR LAYER DEPOSITION

CROSS REFERENCE TO RELATED APPLICATIONS

This application is a National Phase of PCT Patent Application No. PCT/IL2023/050158 having International filing date of Feb. 15, 2023, which claims the benefit of priority of U.S. Provisional Patent Application Nos. 63/310,307, filed Feb. 15, 2022 and 63/437,061, filed Jan. 4, 2023, the contents of which are all incorporated herein by reference in their entirety.

TECHNICAL FIELD

The present invention relates to a method of manufacture of graphene coated surfaces. In particular, the invention relates to coating surfaces by carbon allotropes and layer structures comprising carbon allotropes, in particular graphene and devices containing them.

BACKGROUND ART

Advanced coating has played a significant role in advancing material technologies in the last decades, whether it is in the development of harder coating or low friction coating, optical coating or electrically conducting coatings. The development has been in many cases advanced by the development of new materials, new methods of coating and more complex arrangements of layer structures to achieve a device purpose. Coating has advanced to achieve functional targets by improving physical properties, e.g., forming an advanced layer structure arrangement to provide high electrical conductivity, or by enabling intricate device manufacturing, e.g., miniaturization of integrated circuit elements.

The systematic miniaturization of integrated digital electric circuits elements was and is the main driving force of very large system integration (VLSI) in semi-conductor devices leading to higher circuit element density and lower power consumption. On the other hand, as result of scaling down interconnection metal lines have lower conductivity, and relative increased energy consumption. Typically designed as a multilayered net, high resolution interconnects are formed by repeated steps which include deposition in etched trenches and vias which connect between layers. Thus, there is a need for accurate deposition processes that will enable high quality deposition of interconnect layers at fine resolution at pattern high aspect ratio. High aspect ratio is also related to by a high ratio between the depth of a specific feature and in lateral dimension (“width”).

For example, it is imminent to apply a coating on metal interconnection lines (copper as an illustrative example) that would prevent the diffusion of metal atoms into the silicon and dielectrics around it. In conventional interconnection technologies, a layer of TaN serves as the standard diffusion barrier that also features chemical stability and conformal coating at reduced dimensions. The main disadvantage of TaN coatings is its high electrical resistivity, typically in the range of 100 to 400 μΩcm, e.g., see, M. Tsai, S. Sun, C. Tsai, S. Chuang, and H.-T. Chiu, “Comparison of the diffusion barrier properties of chemical-vapor-deposited TaN and sputtered TaN between Cu and Si”, Journal of Applied Physics, vol. 79, no. 9, pp. 6932-6938, 1996. In addition, it should be noted that features formed through the deposition of a TaN diffusion barrier layer cannot be scaled down in proportion to the reduced cross-sectional area of respective metal conductor interconnects. Consequently, the resistive surface diffusion barrier consumes an increasingly more dominant surface skin on the metal at higher technology generations.

More recently, the emergence of new electronic materials such as graphene has shown potential for use as diffusion barriers in integrated interconnections and as two dimensional electric and thermal conductive layer on surfaces. See for example: R. Mehta et al. *Nanoscale,* 2017, 9, 1827-1833, R. Mehta, et al. *Nano letters,* 2015, 15, 2024-2030 and M. Stelzer et al. *IEEE Journal of the Electron Devices Society,* 2017, 5, 416-425. However, crucial obstacles still prevent industrial application of graphene as a new type of diffusion barrier, mainly in the step of in situ graphene synthesis and non-satisfactory properties of the product.

There is a need for better thin layer coating techniques of surfaces by graphene, for forming better diffusion barrier materials that may provide better conductivity. There is also a need for better graphene coating techniques for forming graphene coatings providing better chemical or mechanical properties and/or better optical properties.

As for better techniques, advanced thin layer coating techniques include Chemical Vapor Deposition (CVD), Atomic Layer Deposition (ALD) and Molecular Layer Deposition (MLD).

Chemical vapor deposition (CVD) is a vacuum deposition method used to produce high quality, and high-performance thin films. In typical CVD, a substrate positioned in a reaction chamber, typically under high or ultra-high vacuum, is exposed to one or more volatile precursors, which react and/or decompose on the substrate surface to produce the desired deposit. Frequently, volatile by-products are also produced, which are removed by gas flow through the reaction chamber.

ALD and MLD are thin-film deposition techniques that, by relying on self-terminating surface chemistry, enable the control of the amount of deposited material down to the atomic or molecular level. See for example: Van Bui, H. et. al., 2017, Chemical Communications 53 (1): 45-71. ALD is used to refer to the deposition of inorganic materials where each precursor leaves one atom per cycle (usually the metal atom component of an organometallic precursor followed by removal of the organic component), while MLD is used to refer to the deposition of organic material precursors, leaving a molecule on the surface. ALD and MLD are deposition techniques based on the sequential use of a gas-phase chemical process, wherein each sequential step is also referred to as a cycle. Typically, ALD use precursors (also called “reactants”). These precursors are deposited in a precisely controlled manner on the surface of a material/substrate and potentially react with the surface of the material, one at a time in a sequential, self-limiting, manner to form thin controlled coating. Typically, a cycle begins with a pulsed release of at least one of the precursors into a reaction chamber, followed by an incubation (“wait”) period in which at least part of the released precursor is deposited on the surface of the material/substrate positioned inside the reaction chamber.

Advanced coatings with carbon allotropes would be desired in many applications. Alternative non-limiting examples of area in which advanced coating with carbon allotropes and, in particular, with graphene are desired, include the use of graphene coating as permeation barrier, a lubricant, light collector, transparent electrode and more.

SUMMARY OF INVENTION

The aim of the invention is to provide a method for forming a graphene coating or a graphene patterned coating on a surface. The aim of the invention according to certain aspects is to provide a method for forming a graphene coating on a surface by thin layer deposition of molecular precursors and their transformation (polymerization) to form a graphene coating.

A further aim of the invention is to provide a protective graphene coating and to provide a method of producing a graphene layer that will keep the surface or substrate intact, serving as a diffusion barrier and/or providing mechanical protection to the substrate.

A further aim of the invention is to provide a protective graphene coating and to provide a method of producing a graphene layer that will keep the surface free from oxidation. A further aim of the invention is to provide a graphene coating to a surface having a minimal number of defects, or essentially no defects of the graphene matrix.

As noted in the above reference, graphene quality and growth temperature are important requirements for efficient forming of graphene barriers for metal conductors such as copper. As is demonstrated in the examples hereinbelow, the method according to the invention provides for forming high graphene quality at relatively low growth temperature. It is an aim of the invention to provide a method of coating performed at relatively low effective temperature range and to provide for controlled graphene quality and controlled substrate temperature.

According to a first aspect of the invention a method for coating a surface with graphene is provided, the method comprising the steps of:

- obtaining a material having a surface and positioning said material in a reaction chamber;
- obtaining a graphene molecular precursor comprising at least one $C_6$-$C_{100}$ aromatic hydrocarbon;
- injecting the graphene molecular precursor from a reservoir into the reaction chamber;
- depositing said at least one graphene molecular precursor on top of the surface to obtain a surface at least partially coated with the at least one graphene molecular precursor; and
- transforming the deposited first graphene molecular precursor into a surface graphene coating, to obtain a graphene coated surface.

According to some embodiments the ratio between the pressure in the reservoir and the pressure in the reaction chamber is higher than 100. According to some embodiments a carrier gas is bubbled through the graphene molecular precursor.

According to some embodiments the material surface temperature is higher than the temperature of graphene molecular precursor. According to some embodiments the surface of the material is maintained at a temperature equal or below 400° C.

According to some embodiments the at least one graphene molecular precursor comprises a $C_6$-$C_{100}$ aromatic hydrocarbon being derivatized by a tethering group. According to some embodiments the graphene molecular precursor comprising at least one compound selected from the group consisting of: compound A having molecular formula I $G^1$-$X^1_iY^1_mY^2_n$, and formula I:

compound B having molecular formula II $G^1$-$X^1_iX^2_jY^1_mY^2_n$ff, and formula II:

compound C having formula III $G^1$-$Y^1_mY^2_n$; formula III:

wherein, $G^1$ is a $C_6$-$C_{100}$ hydrocarbon component, $X^1$ is a first tethering group, $X^2$ is a second tethering group, $Y^1$ is halide, $Y^2$ is selected from the group consisting of hydrogen, halide and —COOH and i, j, m and n are independent integer numbers having a value selected between 1 and 20.

According to some embodiments $Y^1$ is bromide.

According to some embodiments the solvent used in the solution or colloid of the graphene molecular precursor is selected from toluene, benzene, phenyl xylene, dibromomethane, dichloromethane, dibromobenzene, or dichloromobenzene.

According to some embodiments the coated surface comprises a patterned structure characterized by a generalized aspect ratio higher than 3. According to some embodiments the patterned structure comprises a trench or a via.

According to some embodiments the coating is uniform and conformal and the normalized half-thickness penetration depth of the graphene coated pattern is higher than 0.7. According to some embodiments the coating is uniform and conformal and the normalized 80% thickness penetration depth of the graphene coated pattern is higher than 0.4.

According to some embodiments the method is characterized by the Knudsen number correlating the deposited graphene molecular precursor to the 3D pattern dimensions on the surface of the material and the Knudsen number is larger than 30.

According to some embodiments, the number of defects in the formed graphene coating is lower than 1E-10/cm$^2$. According to some embodiments, the number of defects in the formed graphene coating is lower than 1E-11/cm$^2$. According to some embodiments, the number of defects in the formed graphene coating is lower than 1E-12/cm$^2$. According to some embodiments, the graphene coating is formed on an exposed surface of a material and wherein the coating is formed on substantially all the exposed surfaces. According to some embodiments, the surface of the material is a metal surface and the coating is performed on the metal surface.

According to a further aspect of the invention and to embodiments a product comprising a graphene coated surface obtainable by the method is formed. According to some embodiments the product comprises a graphene coated surface having a 3D profile and wherein the coating is uniform and conformal and the 3D pattern has GAR higher than 3.

According to some embodiments the product comprises a graphene coated, the surface having a 3D profile and wherein the coating is uniform and conformal and the normalized 50% thickness penetration depth of the graphene coated pattern is higher than 0.5.

According to a further aspect, the invention provides a device comprising the product disclosed above.

The coating method of the invention enables the use of graphene coating in applications in which it was not possible before. In particular, it allows the coating of surfaces having 3D conformation with high aspect ratio with high uniformity and conformity. Such direct coating provides, inter alia, (i) good thermal and chemical stability; (ii) good thermal conductivity; and (iii) good adhesion or bonding to the target surface, which, in turn, provide also for reliability of the formed coating, and in respective applications also provide for improved conductivity of a formed interconnecting element.

BRIEF DESCRIPTION OF THE DRAWINGS

For better understanding of the present invention and in order to exemplify how it may be implemented in practice, several embodiments are hereby described, which should be interpreted only as non-limiting examples, with reference to the accompanying figures. It is noted that the sizes and scale of the embodiments presented in the figures are exemplary and non-limiting.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein.

DESCRIPTION OF EMBODIMENTS

Figure 1:
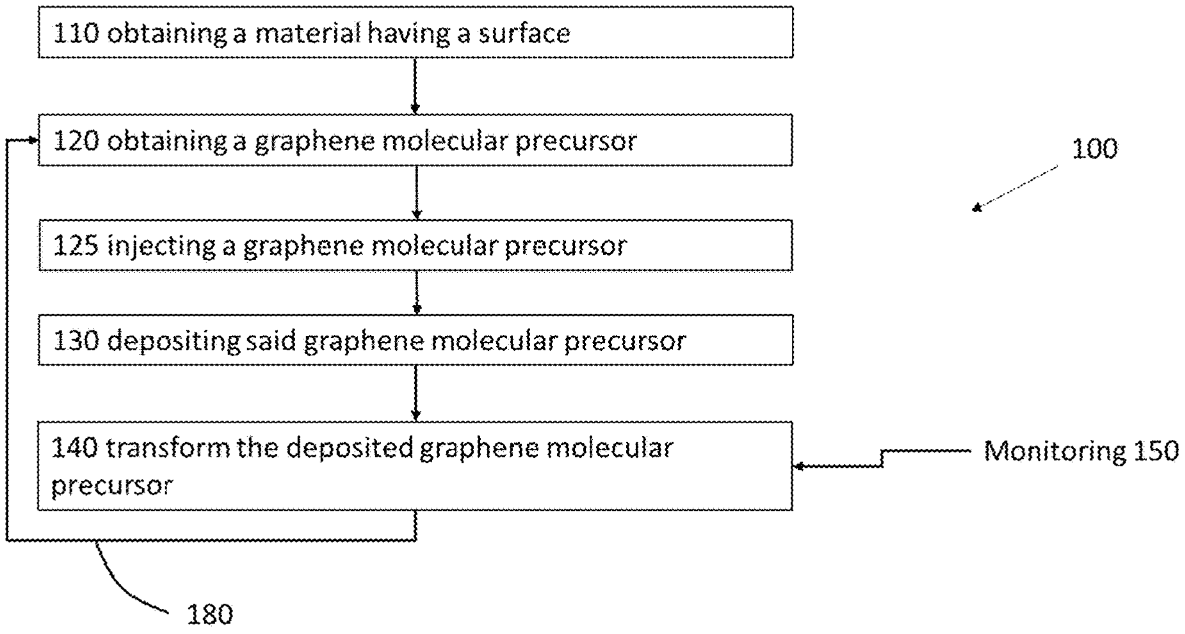
FIG. 1 depicts a block diagram representing a general method for forming a graphene interfacial layer or coating on a surface according to an embodiment of the invention.
Figure 2:
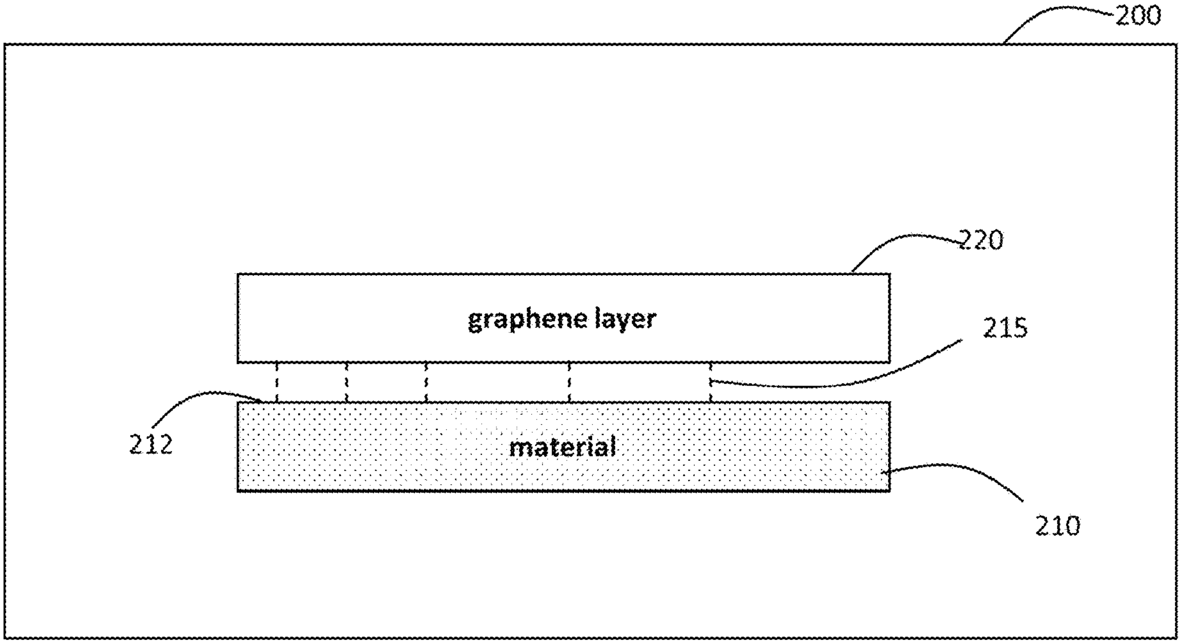
FIG. 2 depicts a schematic representation of the graphene coated surface according to an embodiment of the invention.
Figure 3:
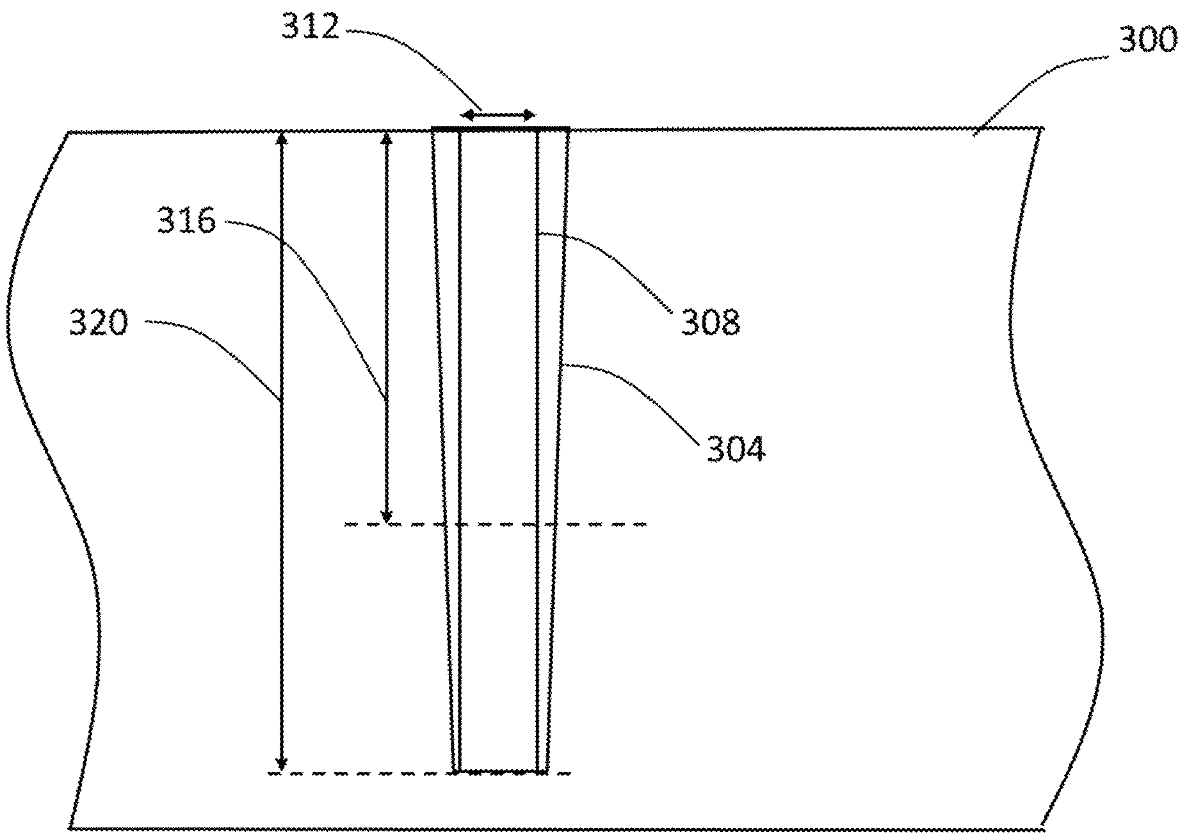
FIG. 3 depicts a schematic representation of a product comprising a 3D pattern according to an embodiment of the invention.

Although the invention is illustrated and described herein as embodied in FIGS. 1 to 3 and examples 1 to 3, the invention is not limited to the details shown because various modifications and structural changes may be made without departing from the invention and the equivalents of the claims. However, the compositions construction and method of production or operation of the invention together with additional objects and advantages thereof will be best understood from the following description of specific embodiments when read in connection with the accompanying drawings.

Method for Coating a Surface with Graphene

According to a first aspect the present invention provides a method for coating a surface with graphene by utilizing thin layer deposition, in particular molecular layer deposition, to obtain a device comprising a surface coated with a graphene coating.

Referring to FIG. 1, a general method for coating a surface with graphene according to an aspect of the invention is disclosed. According to embodiments of the invention the method comprises obtaining a material having a surface (step 110) and obtaining a graphene molecular precursor comprising at least one $C_6$-$C_{100}$ hydrocarbon optionally admixed with a liquid (e.g., a solvent) to obtain a graphene molecular precursor mixture (i.e., the graphene molecular precursor is in a liquid medium as a solution, a colloid or a suspension), and maintaining the graphene molecular precursor in a reservoir (step 120).

The term "graphene" refers an allotrope of carbon consisting of a single layer in which carbon atoms are generally connected by $sp^2$ bonds and forming a 'honeycomb' arrangement. The graphene may be contaminated, e.g., with heteroatoms such as Si, Ge or Sn. Hydrogen atoms may be covalently bonded to the peripheral carbon atoms consisting of the single layer or alternatively be replaced by functional groups which in turn may covalently connect the graphene layer to adjacent surfaces. These functional groups and contaminations together with other defects may in general form a small percent of defects in the graphene idealized structure and aromatic character without significantly changing its conductivity or ability to form a diffusion barrier.

The term "defects" as used herein means a disruption in the normal structure the graphene lattice and includes disruption of the ideal extended pi-bonded network. This includes an absence of a carbon atom in the graphene lattice, presence of $sp^3$ bound carbons in the graphene network instead of $sp^2$ bound carbon atoms, which may be caused by breaking of a C—C bond, the change of conjugation of a C—C bond, intentional introduction of functional groups and/or any other changed hybridization state of a carbon atom (from $sp^2$ to $sp^3$ hybridization). Defects also includes any other form of disruption of the ideal extended pi-bonded network such as disposition, e.g., the formation of localized heptagon-pentagon carbon bond formation or interstation, e.g., the replacement of a carbon atom with a nitrogen atom in the graphene lattice. The singular form "defect" refers to such a change occurring in one location of the graphene lattice.

The term "molecular precursor" refers to a compound that participates in a chemical reaction that produces another compound. Specifically, the term "graphene molecular precursor" refers to a compound or a mixture of compounds that after reaction, their main carbohydrate backbone becomes part of a graphene coating, film or layer. According to certain embodiments the graphene molecular precursor comprises a mixture of $C_6$-$C_{100}$ hydrocarbons. According to some embodiments, the graphene molecular precursor comprises at least one $C_6$-$C_{100}$ hydrocarbons functionalized by a group capable of forming a graphene layer, for example by halides which undergo Ullmann reaction, or acetylenyl (ethynyl) groups undergoing a Diels Alder reaction to yield graphene. According to some embodiments the graphene molecular precursor comprises at least one $C_6$-$C_{100}$ hydrocarbon derivatized by a tethering group capable of bonding by covalent bond to the surface of a material. According to certain embodiments the term graphene molecular precursors does not include molecular precursors that comprise a tethering group. According to some embodiments the hydrocarbon skeleton comprises more than 10 carbon atoms or more than 16 carbon atoms. According to some embodiments the hydrocarbon skeleton comprises less than 50 carbon atoms or less than 30 carbon atoms. hydrocarbon can be an aromatic hydrocarbon. The aromatic hydrocarbon can be a polycyclic aromatic hydrocarbon. The polycyclic aromatic hydrocarbon can be made of at least two fused carbocyclic rings, for example naphthalene, or three fused carbocyclic rings such as phenanthrene.

The hydrocarbon of the at least one compound is the building block of the graphene to be is made of an aromatic carbon skeleton which may be small aromatic molecules such as benzene or consisting of several aromatic rings fused to each other (polycyclic aromatic hydrocarbons). The method according to the invention may employ different graphene molecular precursors comprising compounds having different shapes, in attempt to provide high graphene coverage with a minimal number of defects in the graphene coating. After their deposition on the surface these building block will, later on, form during a transformation step, e.g., by radiation or by maintaining elevated temperature in the reaction chamber, carbon-carbon bonds between them to generate the graphene network.

According to some embodiments, the graphene molecular precursor comprises at least one compound selected from the group consisting of:

compound A having molecular formula I $G^1$-$X^1_i Y^1_m Y^2_n$, and formula I:

compound B having molecular formula II $G^1$-$X^1_i X^2_j Y^1_m Y^2_n$, and formula II:

compound C having formula III $G^1$-$Y^1_m Y^2_n$; formula III:

wherein, $G^1$ is a $C_6$-$C_{100}$ hydrocarbon component, $X^1$ is a first tethering group, $X^2$ is a second tethering group $Y^1$, $Y^2$ are independently selected from the group consisting of hydrogen, halogen radical, —CCH (alkyne group), hydroxyl and —COOH and i, j, m and n are independent integer numbers having a value selected between 1 and 20, According to some embodiments $Y^1$ is a halide such as iodide, bromide or chloride, or fluoride and $Y^2$ is selected from the group consisting of hydrogen, halogen radical, —CCH (alkyne group) and —COOH and i, j, m and n are independent integer numbers having a value selected between 1 and 20.

According to some examples the compound is a $C_6$-$C_{100}$ polycyclic aromatic hydrocarbon (PAH), optionally comprising heteroatoms selected from silicon, germanium, zinc, sulfur, nitrogen and oxygen. In some embodiments the at least one compound is selected from the group consisting of rubrene, coronene, p-hexabenzocoronene, hexa-cata-hexabenzocoronene, pentacene, hexaphenylbenzene, perylene, chrysene, pyrene, PAHs of compounds I-V or combinations thereof.

Hexa-cata-hexabenzocoronene

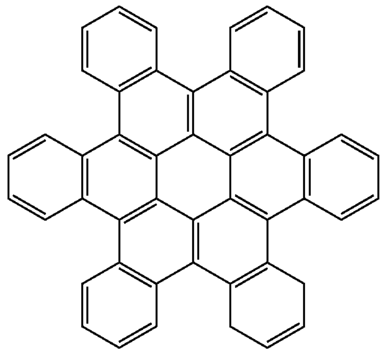

p-hexabenzocoronene

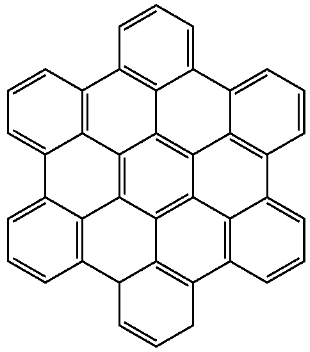

-continued

I

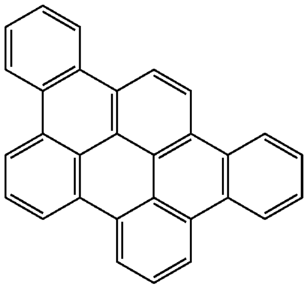

II

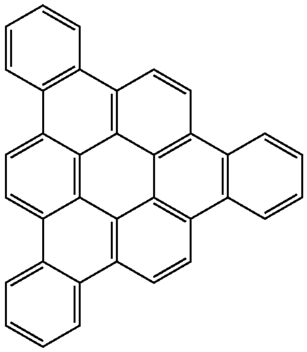

III

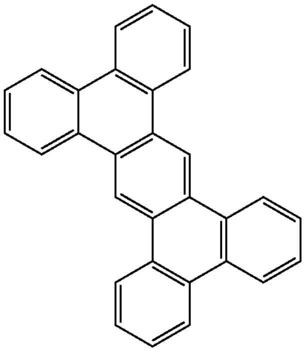

IV

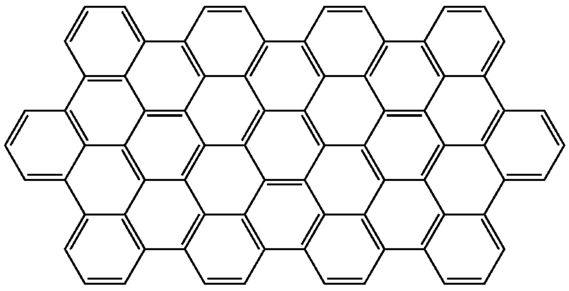

V

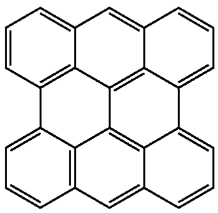

According to some embodiments, the graphene molecular precursor comprises one or more fused five member rings. The five membered rings may confer some curvature to the graphene layer that will be formed.

According to some embodiments $G^1$ is a polycyclic aromatic hydrocarbon (PAH), optionally comprising heteroatoms selected from silicon, germanium, zinc, sulfur, nitrogen and oxygen, comprising no less than 10, 20, 30 or 40 carbon atoms and no more than 100, 90, 80 or 70 carbon atoms.

According to some embodiments, the coated material may be a metal e.g., copper or ruthenium. According to some embodiments the metal is one of copper, ruthenium, gold, nickel, palladium, molybdenum, platinum, tungsten or cobalt alloys thereof, or alloys thereof doped with other metal atoms. It will be clear to a person skilled in the art that with the appropriate selection of the first graphene molecular precursor, practically most metals can be selected. According to some embodiments the coated material may be pretreated to remove contaminations and to prepare the surface of the material, e.g., to smooth out surface roughness and/or reducing metal oxidation. According to some embodiments, the pretreatment may be cleaning by plasma, e.g., argon plasma that may be used to preferably remove organic contaminates or hydrogen plasma which may remove oxide contaminations from a surface, e. g., from an oxidized metal surface. Additionally, or alternatively, a surface may be pretreated by forming gas, e.g., a $N_2/H_2$ mixture that may be used to remove oxides from the surface. This may be performed by maintaining the surface at the forming gas atmosphere at elevated temperature for a preconfigured period, e.g., 30 minutes or 60 minutes.

According to some examples the material may be selected from a wide range of non-metal materials such as a semiconductor compound (silicon, germanium, gallium arsenide), an oxide semiconductor (e.g., zinc oxide), a nitride semiconductor (e.g., gallium nitride) a semiconductor or electrically insulating oxide (e.g., silicon dioxide), a low-K material (e.g., organosilicate glass or porous organosilicate glass), a layered compound (e.g., boron nitride or transition metal dichalcogenide compound) or an organic polymer.

According to some embodiments, the graphene molecular precursor is mixed with a liquid to obtain a graphene molecular precursor mixture where the compound or compounds of the graphene molecular precursor are in a liquid medium. According to some embodiments the liquid is a solvent, and the mixture is a solution. In some embodiments the mixture is a colloid. According to some embodiments the colloid mixture may be a homogeneous mixture or a non-homogeneous mixture. According to some embodiments the solvent can be selected from any solvent which is known in the art to solubilize polycyclic aromatic hydrocarbons (PAHS), or derivatized PAHs such as halogenated PAHs. By way of example, the solvent can be selected from acetone, methyl ethyl ketone, diethyl ether, tetrahydrofuran (THF), hexane, heptane, toluene, benzene, phenyl, xylene (ortho, meta, para or mixture thereof, i.e., xylenes), dibromomethane, dichloromethane, dibromobenzene, or dichlorobenzene or mixtures thereof.

According to some embodiments, the graphene molecular precursor is provided as a powder for deposition through sublimation According to some embodiments, the reservoir is separated from the reaction chamber by a valve. According to some embodiments a manifold connects the reservoir to the reaction chamber. According to some embodiments, the conditions in the reservoir (e.g., temperature and pressure) are different from the conditions in the reaction chamber. According to some embodiments the conditions in the manifold are different from the conditions in the reservoir or the reaction chamber, e.g., the temperature of the manifold may be different from the temperature in the reservoir or the reaction chamber.

Turning back to FIG. 1 further steps of the method are described. According to some embodiments, the method further comprises the step of injecting the graphene molecular precursor from the reservoir into the reaction chamber (step 125). According to some embodiments, performing injection of the graphene molecular precursor mixture into the reaction chamber, comprises at least one of (1) generating a pressure difference between the pressure in the reservoir and reaction chamber and releasing the graphene molecular precursor mixture into the reaction chamber;

(2) carrying the graphene molecular precursor mixture by a carrier gas flowing in the direction according to a pressure gradient; and (3) atomizing the graphene molecular precursor mixture, i.e., generating droplets of the mixture, and releasing the generated droplets in direction into the reaction chamber (according to the pressure gradient). According to some embodiments a nozzle or an ultrasound atomizer is used to atomize the graphene precursor mixture.

According to some embodiments, performing injection of the graphene molecular precursor comprises evaporating or sublimating the graphene molecular precursor from its solid state into the gas phase.

According to some embodiments, injecting the graphene molecular precursor is performed by directing the graphene molecular precursor, flowing in the direction according to a pressure gradient, through the manifold connecting the reservoir to the reaction chamber. According to some embodiments the evaporated graphene molecular precursor is carried by a carrier gas, e.g., $N_2$ or Ar. According to some embodiments injecting the graphene molecular precursor is performed by pulsed injection. According to some embodiments injecting the graphene molecular precursor is performed by continuous injection.

Generally, the graphene molecular precursor is deposited by vacuum deposition. The term "vacuum deposition" relates to a family of processes used to deposit layers of material atom-by-atom or molecule-by-molecule on a solid surface. These processes typically operate at pressures well below atmospheric pressure (i.e., vacuum).

In some embodiments the deposition of the graphene molecular precursor is performed only by "vacuum deposition". In some embodiments, the deposition of the graphene molecular precursor excludes contacting a solution containing the graphene molecular precursor with the surface (such as by spin coating or dipping).

According to some embodiments, the injection of the graphene molecular precursor mixture into reaction chamber is promoted by at least one process that kinematically couples the carrying of the volatile solvent with carrying the low volatility graphene molecular precursor(s). Thus, for example, atomizing of the mixture forms droplets of solvent which comprise the graphene molecular precursor mixture and enables a flow of these droplets into the reaction chamber and thereby, the transfer of the graphene molecular precursor mixture onto the surface of the material that is to be coated. In another example, the graphene molecular precursor is sublimated and supplied into the reaction chamber as a gas. Bubbling a carrier gas over a solid powder reduces the precursor vapor pressure over the solid (powder) and increases the rate of sublimation. According to some embodiments, ratio between the pressure in the reservoir and the pressure in the reaction chamber is higher than 100, 500, 1000 or 10,000. According to some embodiments, the pressure in the reservoir is higher than 10, 20, 100, 200 or 500 Torr and the pressure in the reaction chamber is lower than 1E-1, 1E-2, 1E-3 or 1E-6 Torr. According to some embodiments, maintaining the pressure difference, e.g., by opening a valve for very short periods, enables carrying low volatility graphene molecular precursors from the reservoir to the reaction chamber, by the solvent that has a relative high volatility (high partial pressure). According to some embodiment, a gas carrier is bubbled into the reservoir. According to some embodiments, the gas carrier in a non-reactive gas (with respect to coating process) or an inert gas or chemically reducing gas containing a ratio of 4%-100% hydrogen or combination of the former with plasma ignition of the gas. According to some embodiments, atomizing the graphene molecular precursor mixture may be performed by an ultrasound atomizer or by injecting the graphene molecular precursor mixture through a nozzle. Thus, according to some embodiments the graphene molecular precursor is introduced into the reaction chamber as a gas or an aerosol.

According to some embodiments, the temperature of the reservoir, and in particular the temperature of the graphene molecular precursor mixture maintained in the reservoir is lower than the temperature in which the graphene molecular precursor starts to dissociate or become chemically unstable.

According to some embodiments, products of the reactions in the reaction chamber and unreacted precursors are evacuated from the reaction chamber. According to some embodiments, the injection of the molecular precursors is performed under self-termination conditions which imply that, to begin with, there are more reaction sites, e.g., sites on the surface to adhere to, than molecular precursors in the reaction chamber, at the vicinity of surface sites of interest. This changes as the process advances until the surface sites saturate. However, the self-terminating conditions contribute to the homogeneity and conformality of the coating process. In addition, the flow characteristics of the injected molecular precursors is controlled to provide for homogeneous and conformal coating. According to some embodiments the pressure in the reaction chambers is sufficiently low when graphene molecular precursors are injected therein to provide a large mean free path of the graphene molecular precursors in the gas phase (average distance the molecular precursors will move between collisions). According to some embodiments, to determine if the pressure is sufficiently low or, equivalently, to determine if the mean free path is sufficiently large the mean free path is compared to the dimensions of the pattern of interest (formulas for estimating the mean free path are well known in the art). This ratio is referred to as the Knudsen number. High Knudsen number reflects that in the vicinity of a surface site at the pattern of interest molecular precursors are less hindered (e.g., by other gas phase moieties) from reacting at the surface site (see, e.g., "New development of atomic layer deposition: processes, methods and applications", by P. O. Oviroh et. al., Langmuir 2008, 24, 943-948, doi: 10.1080/14686996.2019.1599694). Thus, for example, if the mean free path of a certain moiety is 5 μm and the width of a trench which is targeted for coating is 50 nm then the ratio (AKA Knudsen number) is 100 which in general reflects favorable conditions for such surface related reactions. Thus, according to some embodiments, the Knudsen number corelating the at least one molecular precursor on interest, to the diameter of the patterns of interest, is larger than 30, 300, 1000 or 5000. For example, if the temperature in the reaction chamber is 200° C., and the pressure is 0.05 Torr, the mean free path of the graphene molecular precursors such as hexabromobenzene with molecular collision diameter ranging between 0.4 nm to 0.6 nm can be calculated. The mean free path is calculated by $$\lambda = \frac{K_b T}{\sqrt{2}\pi d^2 P},$$

where $K_b$ is Boltzmann constant, T is the temperature (° K), d is the molecular diameter (m) and the pressure P is measured in Pascal, and this example is approximately 880 microns. Thus, for features of about 20 nm the Knudsen number is around 4400. Such high values imply that the interactions at the vicinity of such features is mainly surface-particle interaction and not particle-particle interaction. At the presence of other chemical moieties such as the solvent (e.g., Toluene), now in gas phase, the computation is slightly more complex, but the general result is roughly similar.

Turning back to FIG. 1, according to the illustrated methods, the at least one graphene molecular precursor is deposited on top of the surface of a material (step 130) by applying thin layer deposition, to obtain a surface at least partially coated with the at least one graphene molecular precursor and transformed into a graphene coating surface (step 140) to obtain a graphene coated surface. According to some embodiments the temperature of the surface of the material is higher than the temperature in the reservoir and in particular, higher than the temperature in which the graphene molecular precursor starts to become chemically unstable. Thus, according to embodiments, the temperature maintained in the reservoir in the range of 70° C.-110° C., 70° C.-120° C., 70° C.-130° C., 70° C.-150° C., 90° C.-110° C., 90° C.-120° C., 90° C.-130° C., 90° C.-150° C., 110° C.-130° C., 110° C.-150° C. or 130° C.-150° C. According to some embodiments, the temperature in the reaction chamber is not lower than 150° C., not lower than 200° C. or not lower than 250° C., and not higher than 450° C., 400° C., 350° C., 300° C. or not higher than 250° C.

According to some embodiments the transformation is performed without implementing a catalyst for the reaction of transforming the graphene molecular precursor into a graphene coating surface. In some embodiments, the method of the invention does not require a catalyst and therefore does not comprise depositing a catalyst on the deposited graphene layer for transforming the deposited graphene molecular precursor into a surface graphene coating. An example of an advantage of avoiding of the use of a catalyst is that it eliminates a consequent need to remove the catalyst e.g., by acids such as $HNO_3$ or $FeCl_3$ which in turn may be a source to additional of undesired doping in the formed graphene coating the elimination of sources of defects respectively such as nitrogen doping into the graphene structure or $FeCl_3$ residuals. Therefore, the resultant graphene coating surface that is obtained is free of nitrogen doping, free of $FeCl_3$ residuals and/or free of residual metal catalyst (usually metal catalyst nanoparticles) as may be determined by conventionally routine analytical methods. In some embodiments the transformation into a graphene surface occurs instantly upon the deposition of the graphene molecular precursor, and in some embodiments, it occurs after a pause in a separate step. The transformation of the precursor into a surface may require energy which may be provided by heating or radiating. According to some embodiments the transformation of adsorbed graphene molecular precursor into a graphene surface requires an annealing period longer than 20 minutes and shorter than 180 minutes. According to some embodiments a thin film of molecular precursors is deposited through repeated release of several separate precursors, released into the reaction chamber and deposited consecutively from several reservoirs or concomitantly. According to such embodiments and in the case that more than one reservoir is used, each reservoir may be maintained at separate configured and operable temperature and pressure conditions and each graphene molecular precursor mixture may be injected into the reaction chamber independently by injection as disclosed hereinabove.

According to some embodiments the composition of the graphene molecular precursor coating on the surface is controlled by consecutive pulsed deposition. According to some embodiments at least two different graphene molecular precursors (which each may comprise a mixture of compounds) are deposited in a sequential manner. According to these embodiments a procedure for depositing the at least two different graphene molecular precursors is provided, the procedure may provide a list (periodic or non-periodic) of separate deposition steps wherein in each step as one of the different graphene molecular precursors is deposited. Each of the thin layer deposition steps can be characterized by set temperatures of the chamber and of the respective introduced (e.g., evaporated) graphene molecular precursor, by a respective valve opening period, enabling the vaporization (or aerosolization) and release of the respective graphene molecular precursor into the reaction chamber and by a wait/incubation period before opening the next respective valve. According to such embodiments, a heterogeneous molecular layer coating of graphene molecular precursors of substantially statistically uniform distribution is formed on the surface of the coated layer. According to some embodiments, the distribution statistics of the different compounds comprising the graphene molecular precursors on the surface is affected by the molecular affinities between the different compounds and their respective kinetics.

According to some embodiments, the deposition of graphene precursor is followed by a pulse or purge with $H_2O$ (or $NH_3$ or $H_2$), reacting with R—$C_nBr_m$ to produce HBr+ solid carbon graphene film.

According to some embodiments, following the deposition of graphene precursor, a pulse or purge with of metal precursor (Au, Cu, Pt, Ru, Pd, Ni, Co, Mo, W, Fe, or other) is provided. According to some embodiments the metal precursor in provided as an organo-metallic complex (for example $\eta^4$-2,3-dimethylbutadiene Ruthenium tricarbonyl, Ru(DMBD)$(CO)_3$). According to some embodiments, the injection of the metal precursor may also be performed through sublimation (e.g., copper may be deposited through sublimation of acetylacetonate complex with copper, $Cu(C_5H_7O_2)_2$, which may be performed at temperature less than 210° C. and pressure less than 300 Torr, and which may be decomposed to form a copper layer in low temperatures, 220° C. to 250° C., (in a carrier gas such as 1:19 $H_2/N_2$). According to some embodiments, this step is followed by a pulse step of $O_2$ or $H_2O$ or $NH_4$ or $H_2$, depending on the metal type (e.g., a pulse of $H_2O$ in the Ru(DMBD)$(CO)_3$ example), and followed by a purge step removing the volatile reaction products.

According to some embodiments, thin layer deposition may be ALD, which in turn may be any one of thermal ALD, Plasma enhanced ALD (PEALD) also referred to as plasma-assisted ALD or radical-enhanced ALD, hot-wire ALD and photo assisted ALD. Advantages of these ALD processes include precise control the thickness, fill factor and composition of the formed graphene molecular precursor layer/coating. According to some embodiments said thin layer deposition, i.e., depositing the graphene molecular precursor and transforming into a graphene coating is performed in an ALD instrument.

According to some embodiments, the method is configured and adapted as a surface-driven process, in which surface reactions are dominant in the deposition process. According to some embodiments the method is enabled by an ALD or MLD process. As a result, the method enables excellent conformality and thickness control irrespectively of the substrate geometry, providing for uniform deposition of complex geometry with high aspect ratio (pattern depth to width ratio) and even on porous substrate surfaces.

The term "ALD" will be used herein to encompass both ALD and MLD for sake of simplicity.

The term "uniformity" refers to the uniformity of a film or a coating having substantially equal thickness and composition (and other properties) at each position along a planar substrate, e.g., along a 300 mm wafer, wherein the uniformity of each uniform property may respectively be defined by a range or variance or any other statistical descriptor of the property, thus for example composition or defect uniformity may be characterized by the maximum variation in composition or defect number (per area) respectively. Thus, for example, uniformity in the number of layers may define by having a variance in the number of layers by not more than 20 layers, not more than 10 layers, or not more than 4 layers over the relevant tested region.

While uniformity refers to properties (e.g., thickness and composition) on a planar surface the term "Conformality" refers to these properties of a film or a coating e.g., having substantially the same thickness and composition, (and/or other physical properties) also throughout the three-dimensional conformation (or feature) of interest. Thus, for example, a thickness conformal coating of a pattern having 3D features such as trenches, protrusions or vias will have the substantially the same thickness along any location of the pattern. To assess the conformality of a coating of a three-dimensional pattern it is possible to characterize the geometry of the three-dimensional pattern. Three dimensional patterns such as a circular hole, a square hole or a trench may be characterized by a two-dimensional descriptor such as the aspect ratio, i.e., depth to width ratio. This type of descriptor maybe sufficient for a circular hole but in some cases may be insufficient for more complex patterns such as elongated holes, trenches, or elongated pillars. A Generalized Aspect Ratio (GAR) may be calculated as $GAR=L \cdot p/4A$, wherein L is the features depth, p is its perimeter at the top and A is its area at the top. Other quality characterization approaches are, for example, reviewed by Cremers et. al., *Appl. Phys. Rev.* 6, 021302 (2019).

According to some embodiments, the method can be carried out in a wide range of pressures, ranging from high vacuum to atmospheric pressure.

According to some embodiments, surface reactions are substantially driven by thermal energy. Thus, according to some embodiments the method is carried out as an ALD process and is performed at chamber temperatures ranging from 80° C., 100° C., 150° C., 200° C. or 250° C. to 350° C., 400° C. or 450° C. According to some embodiments chamber temperatures are limited to these ranges. The advantage of limiting the temperature of the surface is to eliminate possible thermal damage to the surface or deterioration of a manufactured device performance and/or to prevent uncontrolled damage to the reacting moieties.

According to some embodiments, the ALD comprises an incubation period that may be more than 5 seconds more than 20 seconds, more than 60 seconds, more than 180 seconds, or more than 600 seconds According to some embodiments the number of cycles is more than 10, 50 or 100 cycles. According to some embodiments the number of cycles is less than 300 500 or 1000 cycles. According to some embodiments pulses are arranged in bursts which comprise a small number of pulses with a short wait time between pulses (e.g., 1 to 5 sec) and a significantly longer wait time between consecutive bursts (e.g., 10 to 60 sec). According to some embodiments the number of pulses in a burst is between 4 and 20, the numbers of bursts in a cycle is between 2 and 10, and the number of cycles of bursts is larger than 6 and smaller than 100. According to some embodiments higher hierarchy of pulse burst may be arranged allowing to more complex depositing recipes, e.g., for the use of more than one molecular graphene precursor or the use of longer wait between series of bursts.

According to some embodiments, the method is configured and adapted as a self-terminating process wherein process kinetics is limited, inter alia, by a limited number of reactants (compounds comprising the graphene molecular precursors) or by the availability of active sites on the surface. According to some embodiments, such self-limiting improves the uniformity and conformality of the deposition of the graphene molecular precursors and the uniformity and conformality of the formed coating.

According to some embodiments, the invention provides a method for conformal coating wherein the coated surface comprises a patterned structure characterized by a GAR larger than 5, larger than 10 or larger than 30, wherein the GAR is measured with respect to the geometry of the coated pattern. According to some embodiments, coating conformality is characterized by the extent in which the coating maintains its thickness depth. If for example, a thickness profile is experimentally obtained, then it is possible to determine the depth, for a recess, or the height, for a protrusion, at which the film thickness equals 50% of the film thickness at the top. This penetration depth, designated PD50 or alternatively any proportional thickness ratio, e.g., 80% (designated PD80) may be used to measure the aspect ratio or GAR of the measured pattern coating, with depth L being the measured penetration depth. Thus, a circular hole having PD50 that is 20 times the radius of the circular top will have GAR-PD50 of 10.

According to some embodiments, the surface has a patterned structure comprising at least one via or trench. According to some embodiments the surfaces may be the surfaces of an electronic chip at different stages of manufacturing and wherein the respective surfaces may be semiconductor surfaces, dielectric surfaces metal interconnect surfaces and composite damascene on to which the coating is being applied.

According to some embodiments, the ALD is PEALD, wherein the use of plasma during one of the reacting steps provides highly reactive species such as radicals that promote the growth of the deposited layer, this, in addition to the thermal energy from the substrate may enable the use of a wide range of molecular precursors and may provide for more efficient deposition and transformation of the deposited molecular precursors into a graphene layer. According to such embodiments, the bonding of the molecular precursors to the surface and/or the reactions between the molecular precursors to form the graphene coating may be based on reactions of the highly reactive species. Thus, according to some embodiments, PEALD may be performed at temperatures as low as room temperature. According to embodiments PEALD is performed at chamber pressure lower than 1E-3 Torr.

According to some embodiments, the ALD is Hot-wire ALD wherein the ALD process employs a filament positioned in a filament zone and wherein the filament is heated up to a temperature of up to above 1000° C. According to such embodiments, at least one of the graphene molecular precursors or other moieties participating in the coating process, collectively dubbed, the molecular precursors, is directed to the reaction chamber through the filament zone to activate the respective molecular precursors which may be thermally excited or dissociated. According to such embodiments, by tuning the temperature of the filament, the concentration of the thermally excited or dissociated molecules can be controlled.

As noted above, according to some embodiments, the ALD is photo-assisted ALD, in which, according to some examples photo-energy is absorbed by the graphene molecular precursors or by the substrate's surface to initiate and/or maintain the transformation of the deposited molecular precursor layer into a graphene coating. In some embodiments, photo-induced reactions are promoted by exposure of the reactants to ultraviolet (UV), visible range or infrared radiation. The interaction between reactant molecules and photons can result in the excitation and/or dissociation of the molecules into reactive species, which may lead to specific reactions at the surface of the substrate.

According to some embodiments, the at least one graphene molecular precursor comprises at least one compound bearing periphery functional groups on the periphery of the at least one compound. The formation of the carbon-carbon bonds between the compounds of the graphene molecular precursor(s) can be assisted by having the aromatic skeleton bear good leaving periphery functional groups, e.g., $Y^1$ and $Y^2$ groups on the periphery of the at least one compound. For example, $Y^1$ can be a halide such as —Cl or —Br and $Y^2$ can be a hydrogen —H, such that when the graphene precursor coating is transformed, a halide from one graphene molecular precursor and a hydrogen from another graphene precursor would leave as HCL or HBr and the two graphene molecular precursors would form a carbon-carbon bond. In another example, $Y^1$ can be —Cl and radiation of the graphene molecular precursor film generates carbon-carbon bonds between two carbons (which were linked to —Cl) of two adjacent (same or different) graphene molecular precursor molecules and a $Cl_2$ molecule is generated. The byproduct gas molecules that are generated can be removed from the system by vacuum. According to some embodiments, all of the periphery groups of the compounds comprising the graphene molecular precursor(s) are good leaving groups, i.e., groups having a low activation energy to react or leave at the aforementioned temperatures and conditions in which the compounds comprising the graphene molecular precursor become unstable. According to some embodiments, all of the periphery groups of the compounds comprising the graphene molecular precursor are halides.

In some embodiments $Y^1$ and $Y^2$ can be acidic and basic groups. The basic and acidic functional groups can be on the same compound (e.g., on different regions of the periphery of the carbon skeleton) or there may a mixture of two different compounds which may be provided through separate molecular precursors (and separate ALD cycles), one bearing acidic functional groups and the other bearing basic functional groups. According to some embodiments intermediate moieties may be formed during the deposition step (step 130).

According to some embodiments, a first and a second molecular precursors that have different periphery functional groups $Y^1$ and $Y^2$ are used, e.g., to control the uniformity and defect ratio of the formed graphene films. According to embodiments more than two graphene molecular precursors or mixtures thereof may be used. According to some embodiments, a catalyst may be incorporated into the process; during the series of pulses one or more pulses of the vaporized catalyst are inserted into the chamber and at least partially deposited on the surface of the substrate. According to such embodiments the catalyst may be a metal catalyst selected from Pd, Pt, Cu, Au, Ni, W and Co, or a mixture thereof. According to some embodiments the catalyst is injected into the reaction chamber in an intermediate form, e.g., as a chelate and modified in the reaction chamber to an active form, for example by purging oxygen, ammonia or water vapor According to some embodiments the metal in the chelate form if stripped/disconnected from the connected ligand.

According to some embodiments, catalysts are not used in the process. According to such embodiments reaction rates are controlled by other means such as direct irradiation (e.g., UV, Visible or IR radiation) or maintaining the deposited graphene molecular precursors and substrate at elevated temperatures in the range of 80° C. to less than 400° C., 350° C., 300° C., 250° C. or 200° C.

The chamber can be kept at elevated temperature to ensure sufficient reaction rate. According to some embodiments the temperature of the surface of the material should be kept at temperatures higher than 80° C., 150° C., 200° C. or 250° C.

According to embodiments, the at least one graphene molecular precursor comprising a $C_6$-$C_{100}$ hydrocarbon being derivatized by at least one tethering group. The term "tethering group" refers in the context of the invention to a functional group which is capable of forming a bond (e.g., covalent bond) by means of a chemical reaction with molecular entities being part of the surface. The formation of the covalent bond results in the covalent bonding between the molecule which comprises the tethering group (e.g., the graphene molecular precursor) and the surface (e.g., the metallic or non-metallic surface). According to some embodiments the hydrocarbon is a polycyclic aromatic hydrocarbon (PAH), optionally comprising heteroatoms selected from silicon, germanium, zinc, sulfur, nitrogen and oxygen, comprising no less than 10, 20, 30 or 40 carbon atoms and no more than 100, 90, 80 or 70 carbon atoms. It is noted that in some embodiments, the method excludes the use of graphene molecular precursors having tethering groups to the surface.

According to some embodiments the at least one tethering group is selected from of —$R^1COOR^2$, —$R^1SO_3R^2$, —$R^1PO_3H_2$, —$R^1COH$, —$NR^3R^4$ and —$R^1SH$ wherein $R^1$ is selected from a bond, $C_{1-8}$ saturated or unsaturated, substituted or unsubstituted alkyl; $R^2$ is H or $C_{1-8}$ saturated or unsaturated, substituted or unsubstituted alkyl, $R^3$ and $R^4$ are independently selected from H, $C_{1-8}$ saturated or unsaturated optionally derivatized alkyl or combinations thereof. When the metal to be coated is titanium then $X^1$ may further be selected from —$R^1SiOH$ and $R^1SiCl_3$.

According to some embodiments, the at least one tethering group is selected from the group consisting of $C_6$-$C_{20}$ aryl unsubstituted or substituted by an electron withdrawing group, $C_6$-$C_{20}$ substituted or unsubstituted heteroaryl, —$R^1SiOH$, $R^1SiCl_3$, —$R^1X$, —$NR^3R^4$, —$R^1COOH$, —$R^1SO_3R^2$, and —$R^1PO_3H_2$, or combinations thereof wherein $R^1$ is selected from a bond, $C_{1-8}$ saturated or unsaturated, substituted or unsubstituted alkyl, X is selected from —OH, —Cl, —Br, —F, or —I, $R^3$ and $R^4$ are independently selected from H, $C_{1-8}$ saturated or unsaturated optionally derivatized alkyl.

According to some embodiments, the electron withdrawing group is selected from the group consisting of a halide, —CN, —$NO_2$, —CHO, —$COOR^2$, —C(═O)$R^5$ wherein $R^2$ is H or $C_{1-8}$ saturated or unsaturated, substituted or unsubstituted alkyl $R^5$ is $C_{1-8}$ saturated or unsaturated, substituted or unsubstituted alkyl.

According to some embodiments the at least one tethering group is selected from the group consisting of $C_{1-8}$ siloxyl, —$R^1SO_3R^2$, —$R^1PO_3H_2$, —$SiR^1R^2R^3$, —$NR^4R^5$, —$R^5COOR^6$ and $R^7SH$ wherein $R^1$, $R^2$, and $R^3$ are independently selected from H, —OH, —Cl, —Br, —F, —I, $C_{1-8}$ saturated or unsaturated optionally derivatized alkyl, and at least one of $R^1$, $R^2$, and $R^3$ is —Cl, —Br, —F or —I; $R^4$ and $R^5$ are independently selected from H, $C_{1-8}$ saturated or unsaturated optionally derivatized alkyl; $R^6$ is H or $C_{1-8}$ saturated or unsaturated optionally derivatized alkyl; $R^7$ is a bond or $C_{1-8}$ saturated or unsaturated optionally derivatized alkyl.

Thus, according to some examples the molecular precursor is at least partially reacted with the surface to form covalent bonds between molecules of the graphene molecular precursor and the surface to obtain a surface covalently linked to a graphene molecular precursor layer. For example, when the tethering group is mercaptomethylene then sulfur-metal bonds spontaneously form between the graphene molecular precursor and the metallic surface.

According to some embodiments, the bonding of the graphene molecular precursor to the surface is in an orientation that in a later stage of forming the graphene layer will form a defect in the graphene layer and introduce strain in the formed coating. According to some embodiments the tethering groups provide degrees of freedom that minimize the aforementioned strain. According to some embodiments the structure of the carbohydrate skeleton of the graphene molecular precursor reduces mechanical strain. According to some embodiments, the carbohydrate skeleton of the graphene molecular precursor comprises one or more fused five membered rings to allow deviation from planarity to reduce the strain at the sites of the covalent bonds with the surface.

According to certain embodiments the graphene coating of the surface is performed in chip manufacturing and the graphene molecular precursor is deposited on a surface of a substrate that comprises an interconnect arrangement embedded in a top layer comprising a semi-conductor substrate (e.g., a silicon substrate or a low-K substrate such as organosilicate glass) having electric circuit elements formed on its upper surface. This interconnect arrangement is sometimes referred to as 'damascene' or 'damascene wiring'. In such embodiments, the advantages of working in relatively low temperatures i.e., working at temperatures below 450° C., 400° C., 350° C., 300° C. or 250° C. are explicit as higher temperatures may lead to under performance of manufactured chips, e.g., because of increased interconnect resistance (for example, due to interconnect doping), uncontrolled variation in metallic interconnect grain size, increased surface roughness or increased threshold voltage.

According to some embodiments, the graphene molecular precursors may comprise several compounds wherein each in turn may comprise several of: (i) compounds A or B having tethering groups for covalently bonding to the surface and (ii) compounds C having no tethering groups. According to some embodiments the mol ratio between the combined amount of compounds A and B and the combined amount of compounds C being between 50:1 and 1:5000, preferably between 10:1 and 1:1000 and more preferably between 1:5 and 1:100. According to embodiments in which the graphene molecular precursor is a mixture of compounds, several compound mixtures may form the graphene molecular precursor and may be mixed in advance (concomitantly) or used consecutively in interspersed manner.

According to some embodiments, the thin coating of molecular precursors is transformed into a graphene coating in parallel to the continued cycles of the thin layer deposition process through reactions of precursors between themselves and/or with the surface of the substrate. According to some embodiments the transforming of the molecular precursors into a graphene coating requires additional energy or external initiation.

Following the forming of the graphene molecular precursor layer/coating on top of the surface or in parallel to the depositing, transforming (polymerization) the deposited first graphene molecular precursor coating into a surface bound graphene interfacial layer, (step 140), is performed, to obtain a graphene coated surface comprising a graphene interfacial layer, wherein in some embodiments the interfacial coating is bound to the surface of the material by covalent bonds and in some embodiments, by weak (e.g., adhesion) bonds. In should be noted that the term 'interfacial graphene layer' refers to a graphene coating that is substantially one layer thick and emphasizes that as such the graphene layer facing different media on each of its face. Accordingly, this graphene layer has special properties which may be different from the properties of graphene layers that have the same media on both sides and in particular graphene layers that have other graphene layers on both sides. However, as this interfacial layer is a coating, we will use the terms 'graphene interfacial layer', 'graphene interfacial layer or coating' and 'graphene interfacial coating' interchangeably as will be clear from the context.

Without being bound to theory, according to some embodiments, the transforming of the deposited graphene molecular precursor layer into graphene is a gradual process in which deposited molecular precursors bond in between themselves to form larger and larger networks and patches as soon as the deposited graphene molecular density is sufficient and gradually combine to form a continuous graphene coating, i.e., a single layer. According to some embodiment, this process advances in parallel to the gradual coating of the surface with the graphene molecular precursor. According to some embodiment, interaction of the graphene molecular precursors with the surface promotes the transformation or gradual transformation of the graphene molecular precursor to a graphene coating. According to some embodiments, the surface serves to catalyze a reaction. According to some embodiments in which the graphene molecular precursor is halogenated, the catalyzed reaction is de-halogenation. According to some embodiments, the surface comprises metal. According to some embodiments, possible additional layers of residual graphene molecular precursor may be purged from the formed graphene coating.

According to some embodiments, the transforming of the graphene molecular precursors coating the surface is achieved by maintaining the surface at elevated temperature, preferably at temperatures higher than 150° C., preferably at temperatures higher than 200° C., and more preferably at temperatures higher than 250° C.

According to some embodiments, a first radiation source is used to radiate at wavelengths (light frequencies) and intensity sufficient for conversion of the graphene precursor layer into a graphene film to obtain a surface coated by a graphene interfacial layer or coating wherein the surface being covalently connected to the graphene interfacial layer or coating (step 140). According to certain embodiments radiation of 20,000 $mJ/cm^2$ at 375 nm is sufficient. According to some embodiments, radiation as low as 500 $mJ/cm^2$ at 375 nm is sufficient. According to certain embodiments, radiation of between 500 $mJ/cm^2$ to 20,000 $mJ/cm^2$ at 375 nm is employed. According to certain embodiments radiation of about 500, 600, 700, 1000, 2000, 3000, 4000, 5000, 6000, 7000, 8000, 9000, 10000, 15000 or 20,000 $mJ/cm^2$ at wavelengths in the range 325 to 450 nm is employed. According to certain embodiments the first light source may be a LED or a laser. According to such embodiments, the wavelengths of the first light source may be selected to be preferably absorbed in the graphene precursor layer. Selection of the wavelengths of the first radiation source may be based on absorption ratio between the absorption coefficient of the graphene molecular precursor relative to the absorption coefficient of the surface material or, in case that the metal material in an interconnect laid up on and embedded in a semi-conductor wafer, the weighted (average) absorption coefficient of the composite material comprised by the metal interconnect net and the semi-conductor layer that is part a wafer in which the interconnect net is embedded in. According to certain embodiments, the absorption ratio is larger than 10 and preferably larger than 100. According to certain embodiments the first radiation source is a UV radiation source comprising wavelengths predominantly shorter than 450 nm. Selecting such UV radiation source has important advantages, including potential localization of the radiation to due to the short wavelengths (e.g., supplemented by use of high numerical aperture, low aberration optics) and efficient use of the energy through a photo-excitation process which directly leads to the formation of reactive moieties that react to form the graphene interfacial layer or coating. The above transforming conditions pertain also to additional transforming steps of additional graphene precursor coatings bonded to graphene layers of further process steps that are disclosed further below.

According to some embodiments of the invention the process of the formation of the graphene interfacial layer or coating from graphene precursor is performed at relatively low temperatures, below 450° C. or below 400° C. and in some embodiments, below 350° C. below 300° C., below 250° C. or below 200° C. Process temperature may be controlled by controlling the temperature in a process chamber or by locally controlling the temperature in the region that is exposed to the radiation from the first radiation source and in particular by controlling the temperature in the graphene precursor layer region that is exposed to the radiation from the first radiation source. This can be performed for example by a second radiation source selected to locally irradiate in coordinated fashion said region of the graphene precursor layer radiated by the first irradiation source. The wavelengths of such second radiation source may be selected to have the absorption ratio (between absorption coefficient of the graphene precursor and the absorption coefficient of the surface material) that is higher than 10, in some embodiments higher than 100 and in some embodiments, higher than 1000. An advantage of the use of a combination of localized heating and localized photoexcitation is the ability to precisely localize the formation of the graphene film.

Additionally, or alternatively, the temperature in the reaction chamber, during the polymerization process is monitored by common methods available in the art, for example, by positioning, on the metallic surface, labels containing photo thermal switching dyes, indicative of the maximal temperature on the surface. An example of such labels are non-reversible temperature labels marketed by Omega Engineering Inc. of Norwalk, CT, USA. An infra-red camera or a thermocouple may also be used to monitor the temperature as known in the art.

Alternatively, in certain embodiments, the formation of a graphene interfacial layer or coating from the graphene precursor coating may be performed by irradiation with a first radiation source with sufficient intensity in the IR region and in particular at wavelengths between 1.3 micron and 1.5 micron wherein the first radiation source has an absorption ratio, as defined above, higher than 10, in some embodiments higher than 100 and, in some embodiments, higher than 1000.

According to certain embodiments, the formation of the interfacial graphene layer or coating may be monitored by Raman spectrography. According to such embodiments, a third radiation source is used to generate Raman scattering, typically in the visible or IR wavelength range. Raman scattering is used to characterize the presence of graphene and may provide signals indicative of the regions comprising the un-polymerized graphene precursor layer. Accordingly, in some embodiments, Raman scattering signal indicative of a presence of a full layer of graphene within a detected region (or indicative of elimination of the graphene precursor) is used to indicate the state of the polymerization of graphene precursor layer and when appropriate, to arrest the radiation of light of the first or second source which, in some embodiments, drive the generation of the graphene interfacial layer or coating. According to some embodiments, Raman spectra may also be used to monitor the quality of the formed graphene film using for example the intensity ratio of the respective spectral lines/peaks indicative of the formation of the graphene layer and the exhaustion of the precursor. As for example disclosed in Araujo P. T. et al. *Materials Today* 2012, 15, 98-109, defect density (number of defects per $cm^2$) may be estimated directly from this ratio. Alternatively, coverage ratio or coverage continuity of the graphene film may be used to quantify its quality, measuring the percent of the area of the graphene film that is without defect. However, this measure should be used carefully in the right context as for example, in large, say 100 $cm^2$, transparent electrode 99% coverage can be a 1 $cm^2$ defect or a hundred 1 $mm^2$ defects—two extreme cases which might have very different implications on the quality of the product. According to certain embodiments, the second and third radiation sources may be one and the same source. According to certain embodiments, Raman scattering which is dependent on the temperature of the scattering material is used to probe the temperature of the irradiated graphene precursor layer or the formed graphene interfacial layer or coating, to monitor and control their respective temperatures, thereby enabling better control of process temperature and higher, more repeatable quality of the formed graphene interfacial layer coating. According to some embodiments, the quality and characteristics of the formed graphene coating may be monitored and/or characterized by SEM and XPS which in turn enables controlling the quantity and characteristics of the graphene coating and of the configured bonding to the coated material. According to further aspects of the invention additional monitoring (step 150, FIG. 1) of the process may be performed to increase its reliability and consistency, to perform quality assurance and to detect an authenticity signature of a produced film being part of a device. According to certain embodiments, the formation of the graphene film may be monitored by fluorescence microscopy or spectrography. According to some embodiments, monitoring graphene film formation during manufacture process of graphene interfacial layer or coating of a surface comprises (i) obtaining fluorescent microscope photos at intervals during the process, (ii) identifying fluorescence of a graphene molecular precursor as evidence for deposition of graphene molecular precursor, (iii) identifying reduction of fluorescence intensity of graphene molecular precursor as evidence for transformation of the graphene molecular precursor into graphene film fluorescence incomplete process and (iv) identifying reaching minimal fluorescence intensity as an end point of the manufacturing process of graphene interfacial layer or coating of the metallic surface. According to further embodiments fluorescent microscope photos before and after each step of the process of manufacture may be obtained and used, e.g., as reference. According to some embodiments integrated collection of a fluorescent signal through appropriate optics may be performed instead of or in parallel to taking microscope photos.

According to some embodiments measuring surface contact angle of the substrate and identifying typical surface contact angle measurement may be used as evidence for formation of a desired surface after each step of the manufacturing process.

In embodiments in which a metal catalyst is used, traces of the catalyst remain in the formed graphene film coated non-metallic layer, either as dispersed traces (e.g., atomic layers or nanoclusters) between the graphene layer and the metallic surface or on top of the graphene coating. Thus, spectroscopic signature of the catalyst traces which may be detected (e.g., in expected locations) and may serve as authenticity signature of a produced graphene film on a surface, being part of a device.

According to some embodiments, the graphene coating is formed on exposed surface of a material and the coating is formed on more than 90%, more than 95% or more than 99% of the exposed surface. According to some embodiments, the ratio of defects in the formed graphene interfacial layer or coating may be controlled by controlling the depositing conditions and/or the ratios of different compounds comprising the graphene molecular precursors. In some embodiments, the used graphene molecular precursor comprises compounds without tethering groups or a reduced ratio of compounds that have tethering groups leading to a reduced ratio of defects in the manufactured graphene interfacial layer or coating. Further, the use of use graphene molecular precursor comprising a compound without tethering groups may reduce steric effects and allow for better packing of the compounds of the graphene molecular precursors on the surface further reducing the ratio of potential defect in the graphene layer. The larger the ratio of the compound without tethering groups will result in a lower defect ratio. Controlling other ALD conditions such as temperature profile or pulsing profile (e.g., pulse duration and repetition rate) may further reduce the number of potential defects. According to some examples the ratio of defects in the graphene layer is less than 1E12 defects per $cm^2$, according to some embodiments less than 1E11 defects per $cm^2$ or less than 1E10 defects per $cm^2$. The use of graphene molecular precursor comprising compound B enables for example tethering a second coating or second layer on top the graphene coating while controlling the ratios between compound A to compound B (of the various graphene molecular precursors) may be used for example for controlling the strength the bonding between the different coatings or layers.

In some embodiments, after the graphene coating is obtained small aromatic molecules such as benzene, biphenyl, phenanthrene, anthracene, naphthalene, optionally derivatized by $Y^1$ and $Y^2$ groups defined above, or mixtures thereof can be deposited on top of the graphene interfacial layer or coating followed by further transforming, e.g., activation by elevated temperatures or irradiation, whereas the additional depositing and transforming is configured to fill defects in the graphene film which may have formed. According to some embodiments the deposition of small aromatic molecules, optionally derivatized by $Y^1$ and $Y^2$ groups defined above, or mixtures thereof can be performed as part of a procedure of the deposition and transforming steps, e.g., pulsed deposition in an ALD deposition process.

After completing a first graphene interfacial layer or coating, a new layer of graphene molecular precursors, being same or different from the graphene molecular precursors of the preceding layer may be deposited on top of the formed graphene interfacial layer or coating wherein the graphene coating is substantially similar in its properties (e.g., mechanical properties) and optionally different in the tethering groups or defect and edge properties. According to some embodiments some properties of adjacent graphene layers may be different due to different interactions with adjacent coupled layers (graphene layers or metal or non-metal surfaces), or due to different defect ratios or different tethering ratios and their respective characteristics.

According to some embodiments a procedure used to form a coating of a second graphene molecular precursor may comprise depositing and transforming a mixture of compounds forming the second graphene molecular precursor as described above with the required changes to account for difference of the surface or layer onto which the compounds of the molecular precursor are coated onto and optionally accounting for an additional layer which will be subsequently formed thereon.

The deposition and transforming process can be iterated as much as needed to obtain a desired number of graphene layers or coatings. The graphene molecular precursors can be the same or different in each iteration. According to some embodiments the method further comprises the steps of obtaining a second graphene molecular precursor, depositing of said second graphene molecular precursor on top of the first graphene coated material and transforming the deposited graphene molecular precursor to a top graphene coating. According to some embodiments, these steps are repeated, as indicated by arrow 180 in FIG. 1, to obtain a graphene coating comprising at least three graphene coatings, the graphene interfacial layer being bound to the first surface. For example, the number of coatings may be at least 4 coatings or at least 6 coatings. According to some embodiments the number of graphene layers formed in the thus repeated process is 2 to 12 graphene coating layers, according to some embodiments the number is 2 to 6.

According to some embodiments, after a predetermined number of the deposition cycles, the graphene molecular precursors are irradiated to form a second graphene film as described above. According to some embodiments of the method the surface remains intact during the radiation on the graphene precursor and formation of graphene coating. According to some embodiments, during depositing the conditions for transforming are maintained (e.g., maintaining elevated temperature within the reaction chamber or maintaining irradiation conditions) and transforming the precursor coating coated onto the surface is performed in parallel to the depositing of the graphene molecular precursor.

Graphene Coated Surface

According to a further aspect of the invention and to embodiments a product comprising a graphene coated surface obtainable by the method is formed. The graphene coated surface may exhibit the characteristics of the product of the methos as described above.

According to some embodiments, the surface of the material is a metal surface, and the coating is performed on the metal surface. According to some embodiments the surface of the material is a non-metal surface, and the coating is performed on the non-metal surface. According to some embodiments the graphene film coated surface is for use in a wide range of applications such as, without wishing to be limited thereto, an interconnection in a device selected from the group consisting of back end of lines (BEOL), nano-electro-mechanical device, photovoltaic cells, Organic LED and transparent conductive electrodes, electro-optical sensors, and graphene transistors, or high conduction interconnects.

Reference is made to FIG. 2, schematically illustrating the product of the invention as illustrated with respect to FIG. 1. FIG. 2 schematically illustrates a product 200 comprising a material (210) having a surface (212), and a graphene interfacial layer or coating (220) where the surface 212 in this example is bound to the interfacial graphene layer coating 220, by (i) weak bonds, e.g., adhesion bonds, (ii) pi bonds or by (iii) strong covalent bonds, forming a graphene coated material comprising a covalent bond (215) between the graphene coating and the surface.

According to some embodiments, the product of the invention further comprises the graphene coated material comprising at least two layers of graphene. According to some embodiments the product of the invention further comprises the graphene coated material comprising at least a graphene interfacial layer bound to the surface of the material and a top graphene coating positioned above the graphene interfacial layer. According to some embodiments the product of the invention further comprises forming the graphene coated metal material comprising between 2-6 layers of graphene, in some embodiments 5 to 12 layers of graphene. According to some embodiments the self-terminating deposition process enables the control of the number of layers. According to some embodiments the product of the invention further comprises the graphene coated material comprising a bond between two adjacent graphene coatings. According to some embodiments, the bond between the graphene coating and the surface of the material is selected from a covalent bond ionic bond and a pi interaction as known in the art (e.g., between an electronegative functional group such as an alkyl halide and an aryl derivatized by an electron withdrawing group).

According to some embodiments, the coating uniformity is characterized by uniformity of the number of graphene layers forming the coating of a coated region, wherein the difference between the maximal number of graphene layers in a first location of the coated region and the minimal number of graphene layers in a second location of the coated region is less than 10 layers, 6 layers or 4 layers.

According to embodiments a product of the method is a device that comprises a graphene coated material comprising a graphene coating. According to some embodiments the graphene coating comprises at least two graphene coatings.

Referring to FIG. 3 characterization of the conformality of the coating in a product is illustrated by a schematic section 300 through a coated layer in a region comprising one 3D pattern, e.g., a section through a circular hole 304, having a slightly conic cross section. The circular hole is coated by coating 308 which, according to the schematic example, is getting thinner inside the circular hole. The diameter d of the circular hole, at the top, after coating is marked 312, the depth PD50 is denoted by distance 316 and the GAR-PD50 is PD50/d which is approximately 5. According to some embodiments the product comprises coated patterns characterized by GAR-PD50 that is larger than 3, larger than 5, larger than 10 or larger than 30. Alternatively, the quality of the coating can be described by the normalized depth in which the coating reached a certain coating ratio, thus for example the normalized half-thickness penetration depth (normalized PD50) is the ratio of the depth 316 to the full depth of the circular hole 320. According to some embodiments, this ratio for 3D coated features on the surface of the material according to the method of the invention is higher than 0.5, or higher than 0.7. According to some embodiments the ratio PD80 to the full depth is higher than 0.4, or higher than 0.6.

In some embodiments the graphene coated surface is characterized by at least one of: (i) a graphene defect density equal to or lower than $10^{12}$ defects per $cm^2$, in some embodiments lower than $10^{11}$ defects per $cm^2$, in some embodiments lower than 1 ppm and (ii) essentially free of catalytic metal residue, in some embodiments comprising up to atomic layers of metal catalyst, in some embodiments comprising up to nano-clusters of metal (Pd, Pt, Au Ni, W, Co, Cu) (iii) graphene coverage higher than 90%, 95%, 98%, 99% or 99.5%.

The term "essentially free of catalytic metal residue" means herein that the product comprises less than 3% w/w of metal, in some embodiments less than 1%, in some embodiments less than 100 ppm, in any form of pure metal (layers, film, clusters etc.).

It should be noted that the ability to perform graphene coating according to the method of the invention at temperatures below 45 0° C., below 400° C. or below 350° C. is an enabling feature for including and integrating such graphene coating in the manufacturing of electronic chips. In particular, attempts to coat interconnects at temperatures higher than 500° C. or 450° C. would lead to reduced Mean Time to Failure (MTTF) as a result of increased electromigration and interconnect void formation and the reduction in MTTF, e.g., in the case of copper interconnects, is highly non-linear and almost exponential. In addition, if a diffusion barrier such as TiN or Ta/TaN is used for copper interconnects, and graphene is used for capping the interconnects, it would still be expected that the resistance of interconnects coated by graphene at higher temperatures, e.g., 500° C., would be significantly increased relative to the resistance interconnects that have been coated at the lower temperatures according to the present invention. This increase of resistance is expected due to diffusion of the TIN coating into the copper interconnect at the higher temperature. This higher resistance is evident despite the expected increase of copper grain size at higher temperatures (e.g., at 400° C. median grain size was shown to be smaller than 0.85 micron and at 500° C. larger than 1.0 micron). Thus, according to some embodiments, graphene coated interconnects or similar devices coated according to the invention would be characterized by at least one of (i) interconnect grain size median lower than 0.9 micron, (ii) having a lower degree of shorts and voids compared to a similar interconnect exposed to temperatures higher than 450° C., in some embodiments 30% lower, in some embodiments, 50% lower, in some embodiment 90% lower, in some embodiments 99% lower, and in some embodiments 99.9% lower, or in some embodiments, 99.9% free of voids and shorts and (iii) substantially free of diffusion barrier coating materials in the interconnect metal.

The term "essentially free of diffusion barrier coating materials in the interconnect" means herein that the interconnect metal comprises less than 0.03 atomic percent of diffusion barrier atoms out of the interconnect metal, in some embodiments, less than 0.01 atomic percent, (less than 100 ppm), in some embodiments, less than 50 ppm of diffusion barrier atoms relative to the interconnect metal atoms.

According to a further aspect, the invention provides a device comprising the graphene coated surface. According to embodiments the device is a semiconductor device comprising the graphene coated metallic surface.

The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. Embodiments were chosen and described to best explain the principles of the invention and the practical application, and to enable others of ordinary skill in the art to understand the invention for various embodiments with various modifications as are suited to the particular use contemplated. To the extent that the following description is of a specific embodiment or a particular use of the invention, it is intended to be illustrative only, and not limiting of the claimed invention.

The corresponding structures, materials, acts, and equivalents of all means or steps plus function elements in the claims appended to this specification are intended to include any structure, material, or act for performing the function in combination with other claimed elements as specifically claimed.

References in the specification to "one embodiment", "an embodiment", etc., indicate that the embodiment described may include a particular aspect, feature, structure, or characteristic, but not every embodiment necessarily includes that aspect, feature, structure, or characteristic. Moreover, such phrases may, but do not necessarily, refer to the same embodiment referred to in other portions of the specification. Further, when a particular aspect, feature, structure, or characteristic is described in connection with an embodiment, it is within the knowledge of one skilled in the art to combine, affect or connect such aspect, feature, structure, or characteristic with other embodiments, whether or not such connection or combination is explicitly described. In other words, any element or feature may be combined with any other element or feature in different embodiments, unless there is an obvious or inherent incompatibility between the two, or it is specifically excluded.

It is further noted that the claims may be drafted to exclude any optional element. As such, this statement is intended to serve as antecedent basis for the use of exclusive terminology, such as "solely," "only," and the like, in connection with the recitation of claim elements or use of a "negative" limitation. The terms "preferably," "preferred," "prefer," "optionally," "may," and similar terms are used to indicate that an item, condition or step being referred to is an optional (not required) feature of the invention.

The singular forms "a," "an," and "the" include the plural reference unless the context clearly dictates otherwise. The term "and/or" means any one of the items, any combination of the items, or all of the items with which this term is associated. 11

As will be understood by one skilled in the art, for any and all purposes, particularly in terms of providing a written description, all ranges recited herein also encompass any and all possible sub-ranges and combinations of sub-ranges thereof, as well as the individual values making up the range, particularly integer values. A recited range (e.g., weight percent or carbon groups) includes each specific value, integer, decimal, or identity within the range. Any listed range can be easily recognized as sufficiently describing and enabling the same range being broken down into at least equal halves, thirds, quarters, fifths, or tenths. As a non-limiting example, each range discussed herein can be readily broken down into a lower third, middle third and upper third, etc.

As will also be understood by one skilled in the art, all ranges described herein, and all language such as "up to", "at least", "greater than", "less than", "more than", "or more", and the like, include the number(s) recited and such terms refer to ranges that can be subsequently broken down into sub-ranges as discussed above.

EXAMPLES

Example 1

ALD of a graphene coating on a surface of a silicon wafer can be performed using Savannah® S100 Veeco and the following procedure:

Place Hexabromobenzene, dissolved in toluene 1 mg/ml in the precursor reservoir.

Place a Silicon wafer with thin Cu layer sample in the reactor under Nitrogen atmosphere in the reactor chamber. Set nitrogen flow to 20 sccm.

Set the temperatures in the precursor reservoir, the manifold leading from the reservoir to the reaction chamber and in the reaction chamber respectively to 80° C., 150° C. and 200° C. Stabilize for 10 minutes with 20 sccm nitrogen flow.

Evacuate the reaction chamber to 0.05 Torr,

Perform 8 cycles of 4 bursts of precursor from the reservoir to the reaction chamber, wherein each burst comprises a series of 10 pulses of 15 msec with a wait period of 1 sec between the pulses and a wait of 20 sec between consecutive bursts. Between the cycles wait for 5 min for precursor incubation and transforming into graphene coating.

Purge the reaction chamber by a flow of nitrogen for 20 sec at 20 sccm and cool the system to room temperature.

Deposition of the precursor on the surface can be characterized by XPS and the formation of graphene layer can be characterized by performing Raman Spectroscopy.

Example 2

ALD of a graphene coating on a surface of a silicon wafer using a Ru catalyst provided in an organo-metallic complex can be performed using Savannah® S100 Veeco and the following prescription:

Place Hexabromobenzene, dissolved in toluene 1 mg/ml in a graphene molecular precursor reservoir.

Place Ru precursor: $\eta^4$-2,3-dimethylbutadiene Ruthenium tricarbonyl (Ru(DMBD)$(CO)_3$) in a catalyst reservoir.

Place a Silicon wafer in the reactor under Nitrogen atmosphere in the reactor chamber. Set nitrogen flow to 20 sccm.

Set the temperatures in the graphene molecular precursor reservoir to 70° C., in the Ru precursor reservoir to 70° C., in a $H_2O$ reservoir to 30° C., in the manifold leading from the graphene molecular precursor reservoir to the reaction chamber to 150° C. and in the reaction chamber to 180° C. Stabilize for 10 minutes with 20 sccm nitrogen flow.

Evacuate the reaction chamber to 0.05 Torr,

Perform 8 cycles of 4 bursts of graphene precursor from the reservoir to the reaction chamber wherein each burst comprises a series of 10 pulses of 15 msec with a wait period of 5 sec between the pulses and a wait of 20 sec between consecutive bursts.

Perform Ru catalyst deposition. Provide a 100 msec pulse of Ru(DMBD)$(CO)_3$, wait 5 sec, purge the manifold and chamber by $N_2$ flow for 15 sec, provide a $H_2O$ pulse for 30 msec. Wait 5 seconds for exposure of the Ru catalyst complex to $H_2O$ to initiate the catalyst (i.e., break the organo-metallic complex). Purge the chamber (from $H_2O$) for 15 second by $N_2$ flow.

Wait for 5 min for precursor incubation and transforming into graphene coating.

Purge the reaction chamber by a flow of nitrogen for 20 sec at 20 sccm and cool the system to room temperature.

Example 3

ALD can be used to deposit the graphene molecular precursor mercaptomethylenelhexabenzocoronene onto an interconnect net pattern embedded on a metallic wafer. ALD in a Savannah® 100 Veeco is exemplified. A solution of the graphene molecular precursor in xylene is placed in a reservoir. A ruthenium wafer, copper wafer and cobalt wafer are placed in the reactor. Temperatures in the precursor reservoir, the manifold leading from the reservoir to the reaction chamber and in the reaction chamber are respectively set to 130° C., 150° C. and 250° C. and stabilized for 10 minutes with 20 sccm nitrogen flow. Depositing repeated 100 times ("Cycles"). During each cycle the precursor valve is opened for 0.015 sec ("pulse") and then waiting for exposure 60 sec before evacuating and cleaning with $N_2$ flow.

Graphene synthesis can be performed by maintaining the thin film of the graphene molecular precursor at 250° C. for 60 minutes. Consequently, the ruthenium, copper and cobalt wafers are each covered by the graphene film wherein the surface of the metal wafer is covalently connected to the interfacial graphene layer film.

Characterization of the coated wafers is conducted by XPS, SEM and Raman spectroscopy.

Example 4

ALD can be used to deposit the graphene molecular precursor comprising a mixture of 1:100 mercaptomethylene-hexabenzocoronene/octachloropyrene onto an interconnect net pattern following mutatis mutandis the same procedure and conditions as described in Example 3. The graphene molecular precursor can be applied by placing a 1:100 mercaptomethylene-hexabenzocoronene/octachloropyrene solution in xylene in the reservoir. Alternatively, the deposition of each component of the graphene molecular precursor can be performed sequentially. Following the deposition of the mercaptomethylene-hexabenzocoronene at the conditions detailed above, the process can be repeated at the same conditions with the octachloropyrene, having the latter fill in voids which are left after the deposition of the former.

Consequently, the interconnect net pattern is covered by the graphene film wherein the surface of interconnect net pattern being covalently connected to the interfacial graphene layer film.

ALD is used to deposit the graphene molecular precursor comprising a mixture of 1:100 mercaptomethylene-hexabenzocoronene/octabromopyrene onto an interconnect net pattern following the procedure above.

Characterization of the coated wafers is conducted by XPS and Raman spectroscopy.

Example 5

ALD can be used to deposit the graphene molecular precursor comprising peri-halogen-hexabenzocoronene (90% bromo, 10% chloro) onto a copper wafer, ruthenium wafer and/or cobalt wafer following mutatis mutandis the same procedure and conditions as described in Example 4.

peri-halogen-hexabenzocoronene (90% bromo, 10% chloro) can be prepared as follows:

Materials:

Hexabenzo-Coronene=500 mg. (0.1 m·mole)

Bromine (2+1 ml)=9 g (56 m·moles)

Reduced Iron (catalyst)=10 mg.

Dibromomethane (DBM)=20 mls.

The materials including 2 ml bromine were added to a magnetically stirred glass flask wrapped in aluminium foil and fitted with a reflux condenser. After stirring for one day, a further 1 ml of bromine was added and the stirring was continued for a further day. Any emitted gases were collected and neutralized in a 10% solution of ammonia.

Work-Up:

After 2 days reaction, the contents of the flask were poured into a 5% solution of hydrochloric acid that dissolved the remaining iron and bromine.

The fine black powder dispersed between the aqueous phase and the organic phase, DBM. The aqueous phase was washed with chloroform which was added to the DBM phase. The combined organic phase was centrifuged, and a black powder was obtained. After drying in an oven, the yield was about 0.7 g (Calculated Yield=(1944/523)*500=1, 858 mg).

XRD Analysis:

The dry powder was analysed as previously reported by XRD in the SEM of the Agriculture Faculty of the Hebrew University in Rehovot, Israel. The relative sensitivity of the XRD to bromine and carbon was calibrated by measuring the bromine concentration in hexabromobenzene (Thermo Scientific) as a reference. Then the sample was analysed under identical conditions.

TABLE 1

| Calculation of Bromine Correction Factor | | | |
|---|---|---|---|
| Hexabromobenzene | % O | % C | % Br |
| Measured | 3 ± 2 | 51 ± 11 | 46 ± 13 |
| Theoretical % Br/(C + Br) | 480/552 = 87% | | |
| Measured % Br/(C + Br) | (46 ± 13)/97 = 47 ± 13% | | |
| Br Correction Factor | 87/(47 ± 13) = 1.85 ± 0.4 | | |

TABLE 2

| Bromine and Carbon in Brominated HBC as calculated from XRD measurements | | | | | |
|---|---|---|---|---|---|
| 2-21-10 | % C | % O | % Si | % Cl | % Br |
| Point 1 | 56 | 3 | 0.7 | 3 | 38 |
| Point 2 | 56 | 3 | 0.8 | 3 | 38 |

Calculation of Total Halogens:

$$Br + Cl = 41\% \times \text{Correction Factor}(1.85 \pm 0.4) = 76 \pm 14\%$$

Theoretical Br conc, for tribromination on each external ring of HBC=74%.

Preparation of Xylene Solution:

0.05 g of brominated product was stirred in 500 ml of xylene for about 10 days at room temperature. After slow dissolution a brown translucent solution or colloid was obtained.

Graphene synthesis can be enhanced by maintaining the thin film of the graphene molecular precursor at 250° C. for 60 minutes maintaining period, after the injection of the molecular graphene precursor. During the graphene synthesis, i.e., during the maintaining period, the adsorbed precursor brome and chlore atoms are released from graphene molecular precursor and the adsorbed, de-halogenated moieties combine to form a graphene coating. Consequently, the metal wafers are covered by the graphene film wherein the surface of interconnect net pattern being covalently connected to the interfacial graphene layer film.

Characterization of the coated wafers is conducted by XPS and Raman spectroscopy.

Example 6

ALD of a graphene coating on a surface of a silicon wafer may be performed using Savannah® 100 Veeco by conducting the following:

Hexabromobenzene (HBB) precursor in the form of a powder is inserted into the "Low Vapor Pressure Delivery" (LVPD) cylinder, bubbler kit.

A silicon wafer with thin Cu layer sample in the reactor under Nitrogen atmosphere in the reactor chamber. Nitrogen flow is set to 20 sccm.

Temperatures in the precursor reservoir, the manifold leading from the reservoir to the reaction chamber and in the reaction chamber are respectively set to 140° C., 150° C. and 180° C. and stabilized for 10 minutes with 20 sccm nitrogen flow. Depositing is repeated 100 cycles. During etch cycle the LVPD system valves are opened for 5 sec ("pulse") while the $N_2$ gas is flowing through the bubbler cylinder and carrying the precursor vapor molecules to the reactor chamber, then evacuate and clean the chamber with $N_2$ flow. Graphene synthesis can be performed by maintaining the thin film of the graphene molecular precursor at 250° C. for 60 minutes.

The reaction chamber is purged with a flow of nitrogen for 20 sec at 20 sccm and cool the system to room temperature.

The above procedure can be implemented mutatis mutandis using any of the graphene molecular precursors according to the invention including a graphene molecular precursor comprising peri-halogen-hexabenzocoronene (90% bromo, 10% chloro) in a powder form.

The invention claimed is:

1. A product comprising a graphene coated surface (a) the graphene coated surface having a 3D profile and wherein the coating is uniform and conformal and at least one of the following holds true: (i) the 3D pattern has a generalized aspect ratio (GAR) higher than 3; and (ii) the normalized 50% thickness penetration depth of the graphene coated pattern is higher than 0.5; or (b) when the product is an interconnect, the interconnect being characterized by at least one of: (i) copper grain size median lower than 0.9 micron; (ii) a lower degree of shorts and voids compared to a similar interconnect exposed to temperatures equal or higher than 400° C.; (iii) substantially free of diffusion barrier coating materials in the interconnect metal; (iv) graphene coating being free of nitrogen doping, (v) graphene coating being free of $FeCl_3$ residuals; and (vi) graphene coating being free of residual metal catalyst nanoparticles.

2. A device comprising the product according to claim 1.

* * * * *